US011984910B1

(12) United States Patent
Fan et al.

(10) Patent No.: US 11,984,910 B1
(45) Date of Patent: May 14, 2024

(54) REINFORCEMENT LEARNING-ENABLED LOW-DENSITY PARITY CHECK DECODER

(71) Applicant: Marvell Asia Pte, Ltd., Singapore (SG)

(72) Inventors: Di Fan, Irvine, CA (US); Nedeljko Varnica, San Jose, CA (US); Xuanxuan Lu, San Jose, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 13 days.

(21) Appl. No.: 18/050,387

(22) Filed: Oct. 27, 2022

Related U.S. Application Data

(60) Provisional application No. 63/273,128, filed on Oct. 28, 2021.

(51) Int. Cl.
  *H03M 13/11* (2006.01)
  *G06N 3/04* (2023.01)

(52) U.S. Cl.
  CPC .......... *H03M 13/1108* (2013.01); *G06N 3/04* (2013.01); *H03M 13/1111* (2013.01); *H03M 13/1125* (2013.01); *H03M 13/1128* (2013.01); *H03M 13/1131* (2013.01); *H03M 13/116* (2013.01)

(58) Field of Classification Search
  CPC ......... H03M 13/1108; H03M 13/1128; H03M 13/1125; H03M 13/1131; H03M 13/1111; H03M 13/116; G06N 3/04
  USPC ................. 714/758, 752, 774, 704
  See application file for complete search history.

(56) References Cited

U.S. PATENT DOCUMENTS

| | | | |
|---|---|---|---|
| 11,838,032 B1* | 12/2023 | Pele | H03M 13/015 |
| 2021/0250121 A1* | 8/2021 | Guzelgoz | H04L 1/0051 |
| 2021/0326701 A1* | 10/2021 | Bai | G06N 3/084 |
| 2022/0053347 A1* | 2/2022 | Pezeshki | H04W 24/04 |
| 2022/0190963 A1* | 6/2022 | Horn | H04L 27/2624 |
| 2023/0231575 A1* | 7/2023 | Kliewer | H03M 13/1131 |
| | | | 714/752 |

OTHER PUBLICATIONS

Carpi et al., Reinforcement Learning for Channel Coding: Learned Bit-Flipping Decoding, Aug. 21, 2019, IEEE, pp. 1-8. (Year: 2019).*

(Continued)

*Primary Examiner* — John J Tabone, Jr.

(57) ABSTRACT

The present disclosure describes apparatuses and methods for implementing a reinforcement learning-enabled low-density parity check (LDPC) decoder. In aspects, an RL-enabled LDPC decoder processes, as part of a first decoding iteration, data of a channel to generate LDPC state information and provides the LDPC state information to a machine learning (ML) algorithm of an RL agent. The RL-enabled LDPC decoder is then configured with LDPC decoding parameters obtained from the ML algorithm and processes, as part of a second decoding operation, the data using the decoding parameters to generate subsequent LDPC state information. The RL-enabled LDPC decoder provides decoded data of the channel based on the subsequent LDPC state information. By using the LDPC decoding parameters provided by the ML algorithm of the RL agent, the RL-enabled LDPC decoder may decode channel data in fewer decoding iterations or with a higher success rate, thereby improving LDPC decoding performance.

20 Claims, 13 Drawing Sheets

(56) References Cited

OTHER PUBLICATIONS

Habib et al. RELDEC: Reinforcement Learning-Based Decoding of Moderate Length LDPC Codes, Dec. 27, 2021, cs.IT, pp. 1-31. (Year: 2021).*

Habib et al., Belief Propagation Decoding of Short Graph-Based Channel Codes via Reinforcement Learning, 2021, IEEE, pp. 1-15. (Year: 2021).*

* cited by examiner $$H = \begin{bmatrix} 0 & 1 & 0 & 1 & 0 & 0 \\ 1 & 1 & 0 & 1 & 0 & 0 \\ 0 & 1 & 1 & 0 & 1 & 0 \\ 1 & 0 & 0 & 0 & 0 & 1 \\ 0 & 0 & 1 & 1 & 1 & 1 \end{bmatrix}$$

Parity Check Matrix *H*
402

414 ⟶

1 0 1 1 0
$s = Hz \neq 0$

416 ⟶

Syndrome 412
Check Nodes 410
Variable Nodes 408
Encoded Bits 406

$z$ 0 1 0 1 1 0
$s = Hz = 0$

Tanner Graph of an LPDC Code
404

REINFORCEMENT LEARNING-ENABLED LOW-DENSITY PARITY CHECK DECODER

CROSS REFERENCE TO RELATED APPLICATION

This present disclosure claims priority to U.S. Provisional Patent Application Ser. No. 63/273,128 filed Oct. 28, 2021, the disclosure of which is incorporated by reference herein in its entirety.

BACKGROUND

Many computing and electronic devices transfer data to provide various functions of a device. Data transfer systems, such as data transmission systems and data storage systems, are typically characterized as data channels. In data transmission systems, for example, data can be transmitted via channels such as printed circuit board (PCB) traces, wire cables, fiber-optic cables, wireless protocols, and so forth. In a data storage system, a storage medium to which data is written and from which data is read may be considered a data channel of the data storage system. Thus, a data storage data channel may include magnetic storage media, optical storage media, holographic storage media, solid-state storage media, or the like.

An efficiency and reliability of a data channel can depend on many factors, such as a signal-to-noise ratio (SNR) of the channel. For example, storage media having a high SNR generally enables more accurate storage and recovery of data. On the other hand, storage media having a low SNR can result in high rates of data errors, such as misread or unrecoverable data. Similarly, quality of a digital data communication channel depends on an SNR of the channel, where a high-SNR communication channel can communicate data quickly and accurately and a low-SNR communication channel may have difficulty conveying data through the channel (e.g., dropped data packets).

Error correcting code (ECC) can provide a way to reduce errors in data storage and transmission by introducing data redundancy into a communication channel, typically in the form of extra bits that enable checking of the validity of original data. ECCs utilize codewords, which are specific patterns of bits or symbols in a storage medium or transmission signal, to group data into chunks to be checked for errors. Most ECCs, however, are implemented with a static configuration that may be sub-optimal or unable to account for any variation in the data or the channel by which the data is transferred, which may result in excessive ECC-related processing of data. As such, communication systems or storage systems with static ECC configurations may be inefficient, reduce data throughput, suffer data loss, or consume excess power.

SUMMARY

This summary is provided to introduce subject matter that is further described in the Detailed Description and Drawings. Accordingly, this Summary should not be considered to describe essential features or used to limit the scope of the claimed subject matter.

In some aspects, a method for reinforcement learning-enabled low-density parity check decoding comprises processing, as part of a first decoding iteration, data of a channel with a low-density parity check (LDPC) decoder to generate LDPC state information and providing the LDPC state information to a machine learning (ML) algorithm of a reinforcement learning (RL) agent. The method obtains LDPC decoding parameters from the ML algorithm of the RL agent and configures the LDPC decoder with the LDPC decoding parameters obtained from the ML algorithm. As part of a second decoding iteration, the method includes processing the data with the LDPC decoder using the decoding parameters to generate subsequent LDPC state information. The method then provides decoded data of the channel based on the subsequent LDPC state information that is generated with the LDPC decoding parameters obtained from the ML algorithm By so doing, aspects of an RL-enabled LDPC decoder may enable decoding of channel data in fewer decoding iterations or with a higher success rate, thereby improving LDPC decoding performance.

In other aspects, an apparatus comprises a data interface configured for communication of data through a channel, an RL agent configured to implement an ML algorithm for RL-enabled decoding, and an RL-enabled LDPC decoder. The RL-enabled LDPC decoder is configured to process, as part of a first decoding iteration, data received from the channel to generate LDPC state information and provide the LDPC state information to the ML algorithm of the RL agent. The RL-enabled LDPC decoder obtains LDPC decoding parameters from the ML algorithm of the RL agent and processes, as part of a second decoding iteration, the data using the decoding parameters obtained from the ML algorithm to generate subsequent LDPC state information. The RL-enabled LDPC decoder then provides decoded data of the channel based on the subsequent LDPC state information that is generated with the LDPC decoding parameters obtained from the ML algorithm.

In yet other aspects, a System-on-Chip (SoC) is described that includes a media interface to access storage media of a storage system, a host interface to communicate with a host system, an RL agent configured to implement an ML algorithm for RL-enabled decoding, and an RL-enabled LDPC decoder. The RL-enabled LDPC decoder is configured to process, as part of a first decoding iteration, data read from the storage media to generate LDPC state information and provide the LDPC state information to the ML algorithm of the RL agent. The RL-enabled LDPC decoder obtains LDPC decoding parameters from the ML algorithm of the RL agent and processes, as part of a second decoding iteration, the data with the LDPC decoder using the decoding parameters obtained from the ML algorithm to generate subsequent LDPC state information. The RL-enabled LDPC decoder then provides decoded data of the storage media based on the subsequent LDPC state information that is generated using the LDPC decoding parameters obtained from the ML algorithm.

The details of one or more implementations are set forth in the accompanying drawings and the following description. Other features and advantages will be apparent from the description and drawings and from the claims.

BRIEF DESCRIPTION OF THE DRAWINGS

The details of one or more implementations of a reinforcement learning-enabled (RL-enabled) low-density parity check (LDPC) decoder are set forth in the accompanying figures and the detailed description below. In the figures, the left-most digit of a reference number identifies the figure in which the reference number first appears. The use of the same reference numbers in different instances in the description and the figures indicates like elements.

DETAILED DESCRIPTION

Figure 1:
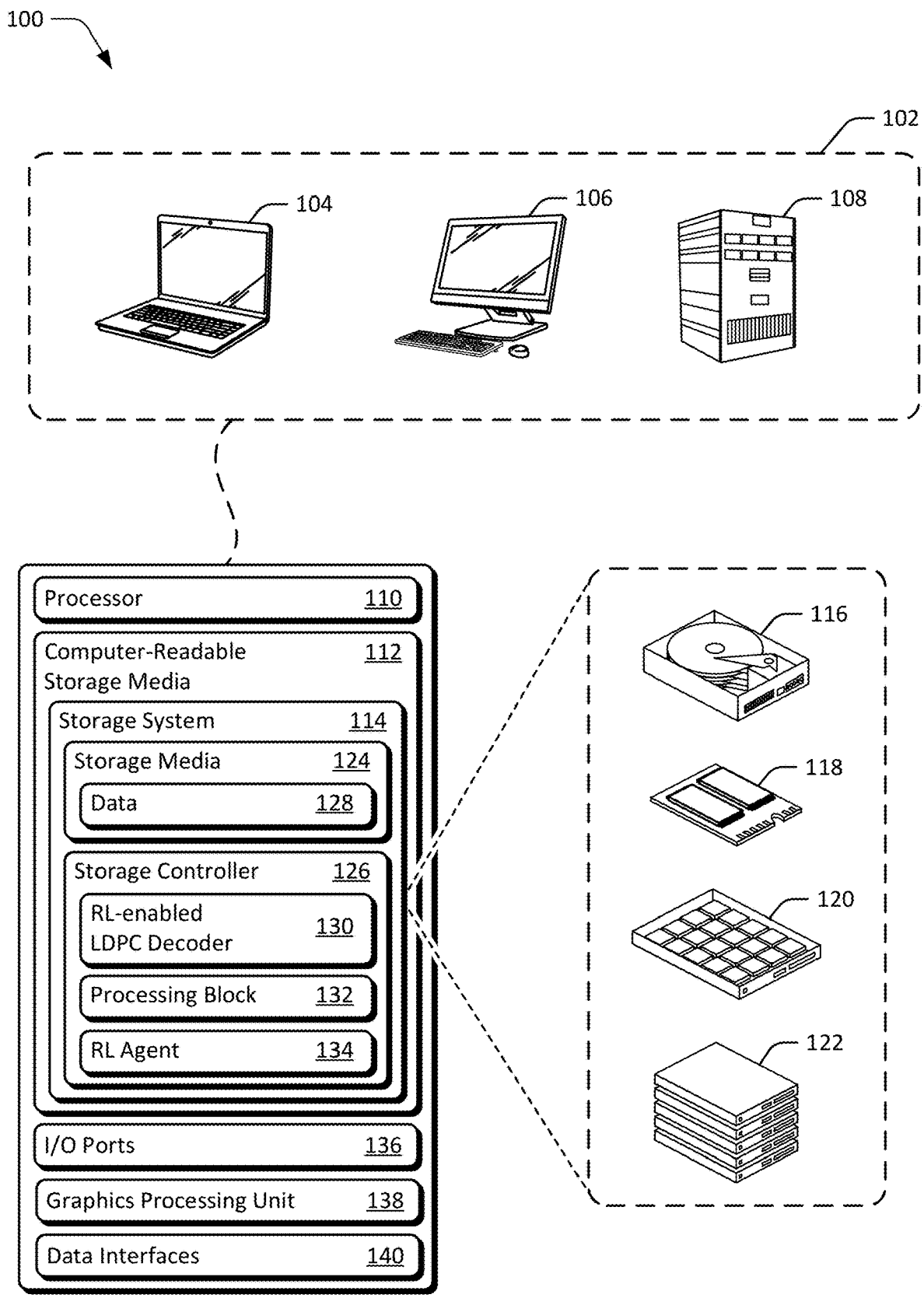
FIG. 1 illustrates an example operating environment having systems in which an RL-enabled LDPC decoder is implemented in accordance with one or more aspects of the disclosure.

Many computing and electronic devices transfer data to provide various functions of a device. Data transfer systems, such as data transmission systems and data storage systems, are typically characterized as data channels. Generally, error correcting code (ECC) can provide a way to reduce errors in data storage and transmission by introducing data redundancy into a communication channel, typically in the form of extra bits that enable checking of the validity of original data. ECCs utilize codewords, which are specific patterns of bits or symbols in a storage medium or transmission signal, to group data into chunks to be checked for errors. Most ECCs, however, are implemented with a static configuration that may be sub-optimal or unable to account for any variation in the data or the channel by which the data is transferred, which may result in excessive ECC-related processing of data. As such, communication systems or storage systems with static ECC configurations may be inefficient, reduce data throughput, suffer data loss, or consume excess power.

This disclosure describes apparatuses and techniques for a reinforcement learning-enabled (RL-enabled) low-density parity check (LDPC) decoder. In contrast with preceding ECC techniques, the described apparatuses and techniques may implement an RL-enabled LDPC decoder that may use machine learning (ML) algorithms to adaptively assist with the LDPC decoding process to improve decoding performance in storage or communication systems. Generally, the described aspects may implement a decoding process based on reinforcement learning (RL), which can be an effective strategy for decoding LDPC codes, including bit-flipping (BF) decoding techniques. In aspects, an RL-enabled LDPC decoder may implement a decoding process in which an RL algorithm or ML algorithm interacts with the LDPC decoder to correct noisy data. Aspects of the RL-enabled LDPC decoder are generally described in the context of an environment setting of the decoder, data processing for translating original noisy codewords to useful states, an action space setting of the decoder, and a reward strategy for training an RL agent of the decoder. These concepts may include two fundamental methodologies described throughout this disclosure, including (i) training and/or optimization of the RL-enabled LDPC decoder implemented through interaction between an RL block and the LDPC decoder and (ii) inference performed in a machine learning (ML) model obtained from training the RL block of the decoder. In aspects, a result of the inference is utilized to aid the RL-enabled LDPC decoder as it progresses through different steps of the decoding process, where one step may include one iteration inside the LDPC decoding process, multiple iterations of the LDPC decoding process inside the LDPC decoder, or a fraction of an iteration of the LDPC decoding process inside the LDPC decoder. The RL-enabled LDPC decoder may implement or employ any suitable RL algorithm, which may include a deep Q-network (DQN), a double-DQN (DDQN), a deep deterministic policy gradient (DDPG), proximal policy optimization (PPO), or other suitable RL algorithms or ML algorithms.

In various aspects of RL-enabled LDPC decoding, an RL-enabled LDPC decoder processes, as part of a first decoding iteration, data of a channel to generate LDPC state information (e.g., a syndrome weight) and provides the LDPC state information to a machine learning (ML) algorithm of an RL agent. The RL-enabled LDPC decoder is then configured with LDPC decoding parameters (e.g., bit flip thresholds and/or bit types) obtained from the ML algorithm and processes, as part of a second decoding operation, the data using the decoding parameters to generate subsequent LDPC state information. The RL-enabled LDPC decoder provides decoded data of the channel based on the subsequent LDPC state information. By using the LDPC decoding parameters provided by the ML algorithm of the RL agent, the RL-enabled LDPC decoder may decode channel data in fewer decoding iterations or with a higher success rate, thereby improving LDPC decoding performance.

The following discussion describes an operating environment, techniques that may be employed in the operating environment, and a System-on-Chip (SoC) in which components of the operating environment may be embodied. In the context of the present disclosure, reference is made to the operating environment or various components by way of example only.

Operating Environment

FIG. 1 illustrates an example operating environment 100 having a host system 102, capable of storing, accessing, or communicating various forms of data or information. Examples of a host system 102 may include a laptop computer 104, desktop computer 106, and server 108, any of which may be configured as a user device, computing device, or as part of a storage network, data storage center, cloud storage, or the like. Further examples of the host system 102 (not shown) may include a tablet computer, a set-top-box, a data storage appliance, a wearable smart-device, a television, a content-streaming device, a high-definition multimedia interface (HDMI) media stick, a smart appliance, a home automation controller, smart thermostat, Internet-of-Things (IoT) device, mobile-internet device (MID), a network-attached-storage (NAS) drive, aggregate storage system, gaming console, automotive entertainment device, automotive computing system, automotive control module (e.g., engine or power train control module), and so on. Generally, the host system 102 may communicate or store data for any suitable purpose, such as to enable functionalities of a particular type of device, provide a user interface, enable network access, implement gaming applications, play back media, provide navigation, edit content, provide data storage, or the like.

The host system 102 includes a processor 110 and computer-readable media 112. The processor 110 may be implemented as any suitable type or number of processors, either single-core or multi-core, for executing instructions or commands of an operating system or other applications of the host system 102. In aspects, the processors 110 of a host system may execute tenants, services, or workloads of a data storage system or data storage center. The computer-readable media 112 (CRM 112) includes memory (not shown) and a storage system 114 of the host system 102. The memory of the host system 102 may include any suitable type or combination of volatile memory or nonvolatile memory. For example, the volatile memory of host system 102 may include various types of random-access memory (RAM), dynamic RAM (DRAM), static RAM (SRAM), or the like. The non-volatile memory may include read-only memory (ROM), electronically erasable programmable ROM (EEPROM), solid-state storage media, or Flash memory.

The storage system 114 of the host system 102 may be configured as any suitable type of data storage system, such as a data storage center, storage device, storage drive, storage array, storage volume, or the like. Although described with reference to the host system 102, the storage system 114 may also be implemented separately as a stand-alone device or as part of a larger storage collective, such as a network-attached storage device, external storage drive, data storage center, server farm, or virtualized storage system (e.g., for cloud-based storage or services). Examples of the storage system 114 include a magnetic storage media drive 116, a non-volatile memory express (NVMe) solid-state drive (not shown), a peripheral component interconnect express (PCIe) solid-state drive 118, a solid-state drive 120 (SSD 120), and a storage array 122, which may be implemented with any combination of storage devices or storage drives.

The storage system 114 includes storage media 124 and a storage media controller 126 (storage controller 126) for managing various operations or functionalities of the storage system 114. The storage media 124 may include or be formed from non-volatile memory devices on which data 128 or information of the host system 102 is stored. The storage media 124 may be implemented with any type or combination of storage media, which may include optical storage media, magnetic storage media, holographic storage media, solid-state storage media, or the like. In aspects, a solid-state memory media may include one of Flash memory, NAND Flash, RAM, DRAM (e.g., for caching), SRAM, or the like. For example, the storage media 124 of the storage system 114 may include NAND Flash memory, single-level cell (SLC) Flash memory, multi-level cell (MLC) Flash memory, triple-level cell (TLC) Flash, quad-level cell Flash (QLC), NOR cell Flash, or any combination thereof. These memories, individually or in combination, may store data associated with a user, applications, a tenant, a workload, a service, and/or an operating system of the host system 102.

Generally, the storage controller 126 manages operation of the storage system 114 and enables the host system 102 to access the storage media 124 for data storage. The storage controller 126 may be implemented through any suitable combination of hardware, firmware, or software to provide various functionalities of the storage system 114. The storage controller 126 may also manage or administrate internal tasks or operations associated with the storage media 124, which may include data placement, data-to-block mapping, wear-leveling, data caching, data migration, garbage collection, thermal management (e.g., throttling), power management, or the like. As such, the storage controller 126 may receive read requests (e.g., host I/Os) from the host system 102 for data access and queue (or generate) internal commands (e.g., I/Os) associated with internal operations for the storage media 124. Generally, the storage controller 126 may perform media I/Os for access of the storage media 124 that correspond to scheduled host I/Os for data access (e.g., host write requests or read requests) and/or internal I/Os for internal operations or tasks associated with the storage media 124.

In this example, the storage controller 126 also includes a reinforcement learning-enabled LDPC decoder 130 (RL-enabled LDPC decoder 130), a processing block 132, and a reinforcement learning (RL) agent 134 (RL agent 134). In other configurations, the storage controller 126 may have access to the RL agent 134, machine learning (ML) algorithms, or neural networks that are implemented separately from the RL-enabled LDPC decoder or storage controller 126. In various aspects, the RL-enabled LDPC decoder 130 uses the processing block 132 and RL agent 134, which may be configured to assist or optimize decoding parameters for decoding data read from the storage media 124 of the storage system 114. Generally, the RL-enabled LDPC decoder 130 and RL agent 134 may implement adaptive or RL-optimized decoding of ECC data read from the storage media 124 of the storage system 114. In some cases, the RL-enabled LDPC decoder 130 or processing block 132 provides the RL agent 134 with LDPC state information during a decoding process and the RL agent 134 determines LDPC decoding parameters for the RL-enabled LDPC decoder. The LDPC decoding parameters provided by the RL agent 134 may enable the RL-enabled LDPC decoder to decode the data in fewer decoding iterations or with a higher success rate, thereby improving LDPC decoding performance.

For example, the RL-enabled LDPC decoder can process, as part of a first decoding iteration, data of a channel to generate LDPC state information (e.g., a syndrome weight) and provide the LDPC state information to the RL agent 134 or an ML algorithm of the RL agent. The RL agent then provides LDPC decoding parameters (e.g., bit flip thresholds and/or bit types) based on the state information that is provided to the ML algorithm. The RL-enabled LDPC decoder is configured with the LDPC decoding parameters and processes, as part of a second decoding operation, the data using the decoding parameters to generate subsequent LDPC state information. The RL-enabled LDPC decoder provides decoded data of the channel based on the subsequent LDPC state information, which may be determined during the second or any subsequent iteration of decoding. By using the LDPC decoding parameters provided by the ML algorithm of the RL agent, the RL-enabled LDPC decoder may decode channel data in fewer decoding iterations or with a higher success rate. This is but one example of RL-enabled LDPC decoding, other examples of which are described throughout the disclosure.

Returning to FIG. 1, the host system 102 may also include I/O ports 136, a graphics processing unit 138 (GPU 138), and data interfaces 140. Generally, the I/O ports 136 allow the host system 102 to interact with other devices, peripherals, or users. For example, the I/O ports 136 may include or be coupled with a universal serial bus, human interface devices, audio inputs, audio outputs, or the like. The GPU 138 processes and renders graphics-related data for the host system 102, such as user interface elements of an operating system, applications, or the like. In some cases, the GPU 138 accesses a portion of local memory to render graphics or includes dedicated memory for rendering graphics (e.g., video RAM) of the host system 102.

The data interfaces 140 of the host system 102 provide connectivity to one or more networks and other devices connected to those networks. The data interfaces 140 may include wired interfaces, such as Ethernet or fiber optic interfaces for communications over a local network, an intranet, or the Internet. Alternately or additionally, the data interfaces 140 may include wireless interfaces that facilitate communication over wireless networks, such as wireless LANs, wide-area wireless networks (e.g., cellular networks), and/or wireless personal-area-networks (WPANs). Any data communicated through the I/O ports 136 or the data interfaces 140 may be decoded using the aspects described herein. For example, a decoder of a data interface may be configured as an RL-enabled LDPC decoder and implement one or more of the techniques described to decode data received through a communication channel. Alternatively or additionally, data read from the storage system 114 of the host system 102 may be decoded and/or re-encoded for communication over the data interfaces 140 in accordance with one or more aspects of RL-enabled LDPC decoding.

Figure 2:
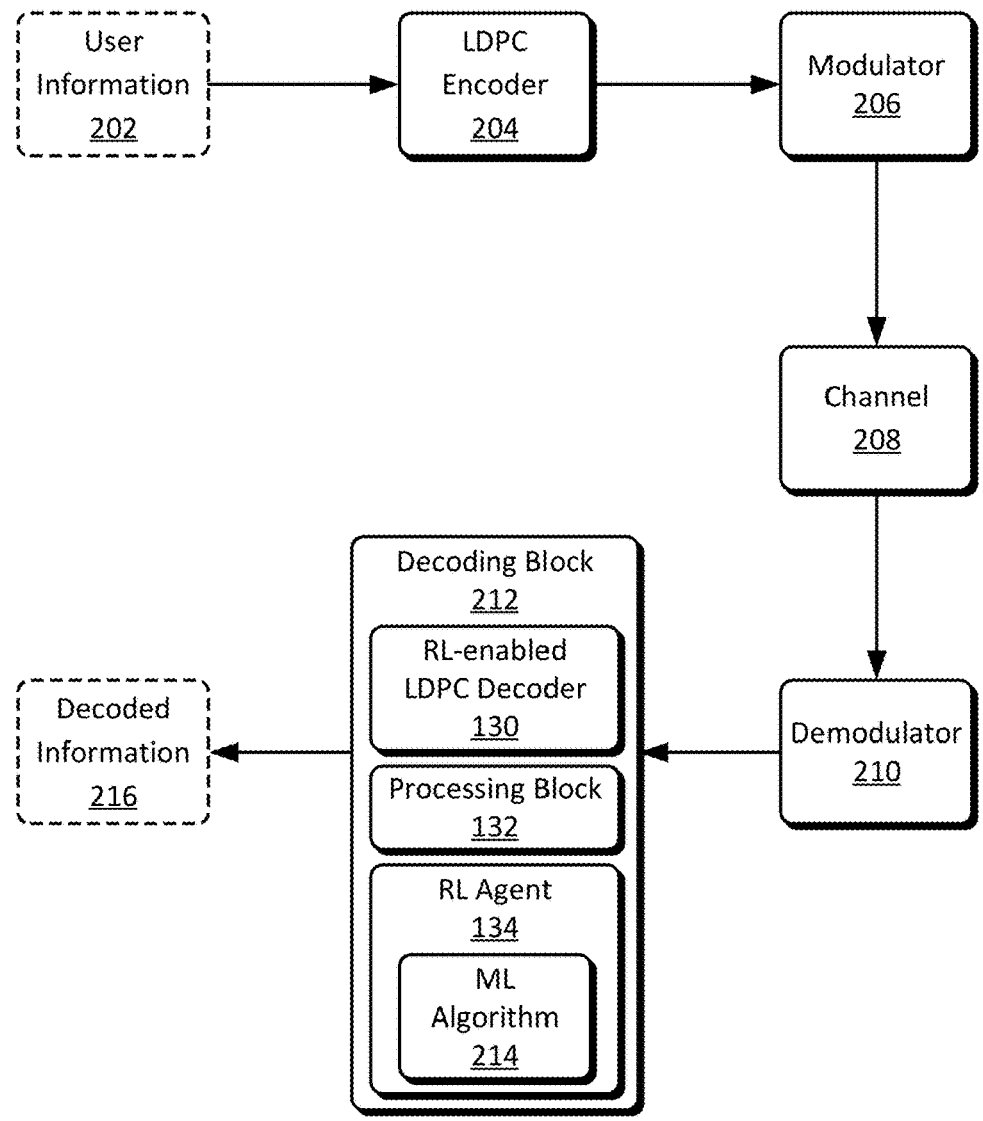
FIG. 2 illustrates an example of a data channel in which a decoder may implement aspects of RL-enabled LDPC decoding.

FIG. 2 illustrates at 200 an example of a data channel in which a decoder may implement aspects of RL-enabled LDPC decoding. Generally, the data channel illustrated may represent a medium through which data is transmitted to a receiver, or a medium which data is stored to and read from. In some cases, the data channel of FIG. 2 represents a medium in which encoded data is exposed to noise or interference, such as a wired medium, a wireless medium, a storage medium, or the like. Thus, noise or interference of the data channel may alter (e.g., introduce coding errors) any encoded and/or modulated data transmitted through or stored to the data channel by an electronic device. As described herein, aspects of RL-enabled LDPC decoding may improve decoder performance to correct such errors in fewer decoding iterations or with higher error-correction success rates.

In the context of the data channel of FIG. 2, user information 202 is encoded by an encoding mechanism, which in this example is illustrated as an LDPC encoder 204. The user information 202 may include any suitable type of information or data (e.g., message information, message vector) which may be grouped into units of k symbols, where each symbol may be binary, ternary, quaternary, or any other suitable type of data. For the sake of simplicity, implementations of the present disclosure will be described in terms of binary bits. In the process of encoding the user information 202, any suitable codes may be used by an encoding block to achieve different results. In this example, the LDPC encoder 204 encodes the user information 202 using an LDPC code to produce one or more codewords (not shown) of encoded information. The LDPC encoder 204 may be configured to implement various LDPC encoding schemes or produce codewords of one or more predetermined lengths. In aspects, the LDPC encoder 204 provides or sends the codewords to a modulator 206, which prepares codewords for transmission on a channel 208. By way of example, the modulator 206 can modulate the codewords using phase-shift keying, frequency-shift keying, quadrature amplitude modulation, or any suitable modulation technique to convert the codewords into one or more information-carrying signals. Encoded data or modulated data may then be written or stored to the channel 208, which represents media through which the information-carrying signals travel or to which the information-carrying signals are stored. For example, the channel 208 may represent a wired or wireless medium of a communication system, a solid-state media (e.g., RAM, ROM), a magnetic media (e.g., a hard disk, tape drive), or an optical media (e.g., DVD, holographic) storage medium in which the information-carrying signals may be stored.

Due to interference signals and other types of noise and phenomena, the channel 208 may affect or corrupt the information-carrying signals generated by the modulator 206. Thus, a waveform of the information-carrying signals received by a demodulator 210 may be different from an original waveform of the information-carrying signals entering the channel 208. The demodulator 210 demodulates the information-carrying signals received through or from the channel 208 and may implement filtering, multiplication by periodic functions, or any suitable demodulation technique corresponding to a type of modulation implemented by the modulator 206. Due to the non-ideal nature of the channel 208 (e.g., noise), the result of the demodulation may include a demodulated bit or bit stream (e.g., received vectors) that may contain errors due to channel corruption.

To recover data from the demodulated signals (e.g., received vectors), a decoding block 212 may decode the bit stream or vectors to detect and/or remove errors resulting from the channel 208. In this example, the decoding block 212 includes an RL-enabled LDPC decoder 130, a processing block 132, and an RL agent 134, which may implement one or more ML algorithms 214. Generally, the RL-enabled LDPC decoder 130 may detect and/or correct errors in data received from the channel, such as encoded information read from a storage medium. The RL-enabled LDPC decoder 130 may implement an iterative decoding algorithm (e.g., flooding decoding, layered decoding, bit-flipping decoding) to detect and/or correct errors in demodulated data or vectors provided by the demodulator 210. In aspects, the RL-enabled LDPC decoder 130 is configured as a bit-flipping decoder to iteratively decode noisy data received from the channel 208. When utilizing such an iterative algorithm, the RL-enabled LDPC decoder 130 may perform several iterations of bit-flipping operations until an output of the RL-enabled LDPC decoder 130 converges to a valid codeword. As described herein, during the decoding process, the RL agent 134 may assist the RL-enabled LDPC decoder 130 by providing decoding parameters based on an output of the ML algorithm 214. For example, the RL-enabled LDPC decoder 130 may provide LDPC state information (e.g., syndrome weight) to the ML algorithm 214, which may then provide a revised bit flip threshold or bit-type selection for the decoding process. When the RL-enabled LDPC decoder 130 converges to a valid codeword or reaches a maximum iteration limit, the RL-enabled LDPC decoder 130 provides decoded information 216, which may correspond to the original user information 202 sent through the channel 208 if error correction by the RL-enabled LDPC decoder is successful.

Figure 3:
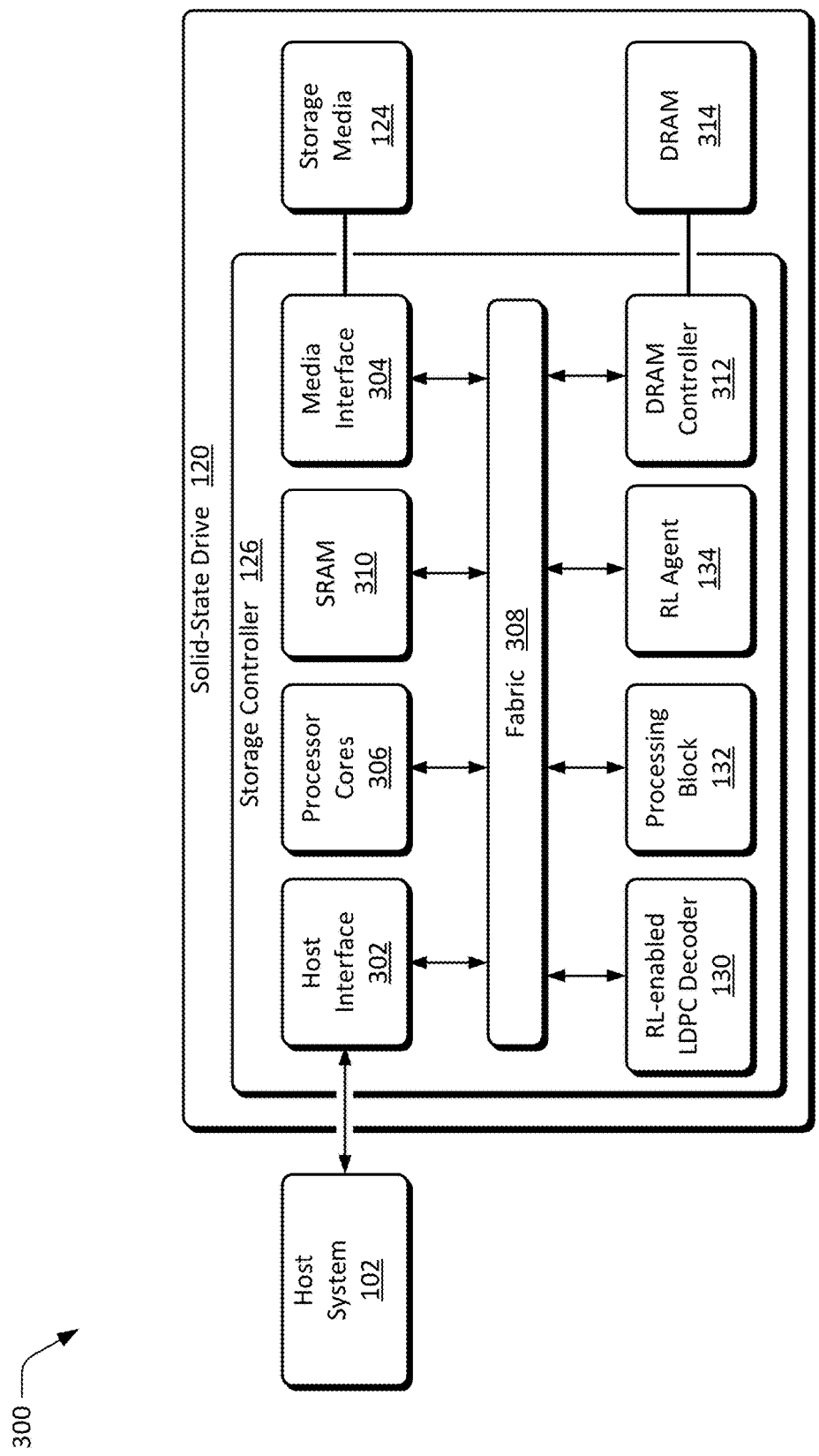
FIG. 3 illustrates an example configuration of a storage system that includes an RL-enabled LDPC decoder implemented in accordance with one or more aspects.

FIG. 3 illustrates at 300 an example configuration of a storage system that includes an RL-enabled LDPC decoder implemented in accordance with one or more aspects. In this example, a storage controller 126 of a storage system 114 includes instances of an RL-enabled LDPC decoder 130, a processing block 132, and an RL agent 134, which may be implemented as or be a part of a decoding block of the storage controller 126. The storage controller 126 may be configured to manage or enable access of a host system 102 to any suitable type of storage media 124, and may include or implement corresponding functions, such as a Flash translation layer (not shown) or the like. The RL-enabled LDPC decoder 130 may interact with the storage controller 126 or components thereof to implement aspects of RL-enabled LDPC decoding.

In this example, the RL-enabled LDPC decoder 130 and RL agent 134 are illustrated in the context of a storage system 114 that is implemented as an instance of a solid-state storage drive (SSD) 120. The SSD 120 may be coupled to any suitable host system 102 and implemented with storage media 124 that includes multiple NAND Flash dies (not shown). Alternatively, the example storage system may be implemented with magnetic storage media, an optical storage media, or the like. Although illustrated as components of the SSD 120, the RL-enabled LDPC decoder 130, processing block 132, and/or RL agent 134 may be implemented separately from or external to the storage system 114. In some cases, the RL-enabled LDPC decoder 130 or RL agent 134 are implemented as part of a storage media accelerator or aggregate storage controller coupled between the host system 102 and one or more storage systems 114.

Generally, operations of the SSD 120 are enabled or managed by an instance of the storage controller 126, which in this example includes a host interface 302 to enable communication with the host system 102 and a media interface 304 to enable access to the storage media 124. The host interface 302 may be configured to implement any suitable type of storage interface or protocol, such as serial advanced technology attachment (SATA), universal serial bus (USB), PCIe, advanced host controller interface (AHCI), NVMe, NVM-over Fabric (NVM-OF), NVM host controller interface specification (NVMHCIS), small computer system interface (SCSI), serial attached SCSI (SAS), secure digital I/O (SDIO), Fibre channel, any combination of these protocols (e.g., an M.2 or next generation form factor (NGFF) combined interface), or the like. Alternately or additionally, the media interface 304 may implement any suitable type of storage media interface, such as a Flash interface, a Flash bus channel interface, a NAND channel interface, a physical page addressing (PPA) interface, a read/write channel interface (e.g., for magnetic media), or the like.

In various aspects, components of the storage controller 126 provide a data path through the controller between the host interface 302 to the host system 102 and the media interface 304 to the storage media 124. In this example, the storage controller 126 includes processor cores 306 for executing a kernel, firmware, or a driver to implement functions of the storage controller 126. In some cases, the processor cores 306 may also execute processor-executable instructions to implement the RL-enabled LDPC decoder 130 or the RL agent 134 of the storage controller 126. Alternately or additionally, the RL-enabled LDPC decoder 130 or the RL agent 134 may execute from or run on ML-specific hardware, AI engines, or processor cores.

As shown in FIG. 3, a fabric 308 of the storage controller 126, which may include control and data buses, operably couples and enables communication between the components of the storage controller 126. For example, the RL-enabled LDPC decoder 130 or processing block 132 may communicate with the host interface 302, processor cores 306 (e.g., firmware), or media interface 304 to exchange data, decoding information, commands, or I/Os within the storage controller 126. In aspects, the RL-enabled LDPC decoder 130 may implement RL-assisted decoding of information (e.g., codewords) read from the storage media 124, which may be performed responsive to read requests by the host system 102. Generally, the RL-enabled LDPC decoder 130 and processing block 132 may use the RL agent 134 to assist with or provide RL- or ML-enabled decoding of codewords to provide error detection and/or error correction for data read from the storage media 124. A static random-access memory 310 (SRAM 310) of the storage controller 126 can store processor-executable instructions or code for firmware or drivers of the storage controller, which may be executed by the processor cores 306. The storage controller 126 may also include a dynamic random-access memory (DRAM) controller 312 and an associated DRAM 314 for storage or caching various data as the storage controller 126 moves data between the host system 102, storage media 124, and other components of the storage controller.

Figure 4:
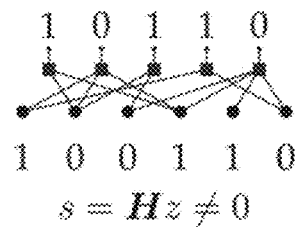
FIG. 4 illustrates example Tanner graphs of LDPC data that may be processed with an RL-enabled LDPC decoder.
Figure 4:
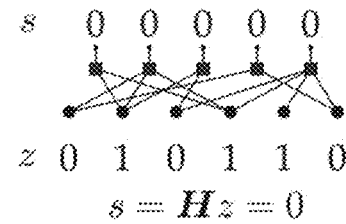

FIG. 4 illustrates at 400 example Tanner graphs of LDPC data that may be processed with an RL-enabled LDPC decoder. In the context of a storage system or a communication system, data received from a channel may include encoded data or codewords that the RL-enabled LDPC decoder 130 (not shown) attempts to decode to provide or reproduce the original data that is written or transmitted to the channel In the context of a storage system, when data is read from storage media, such as NAND Flash memory, the data may include bit errors (e.g., 0s are flipped to 1s, 1s are flipped to 0s). Generally, an encoder can apply an LDPC code to data before the data is transmitted through the communication channel (e.g., before writing to storage media), and the RL-enabled LDPC decoder 130 can decode the LDPC-encoded data after the encoded data is received from the communication channel (e.g., after reading from the storage media). In aspects, the RL-enabled LDPC decoder is implemented as a bit-flipping LDPC decoder, which can flip bits when decoding the encoded data to potentially flip incorrect bits to original values as transmitted or written to the channel.

By way of example and as shown in FIG. 4, an LDPC code is typically defined by a parity check matrix H 402, such as for a codeword of encoded bits or the like. An LDPC code may also be represented by a bipartite Tanner graph 404 of encoded bits 406, where each bit "1" in the parity check matrix H 402 is represented by an edge between a corresponding variable node 408 (column) and a corresponding check node 410 (row). During the decoding process, the RL-enabled LDPC decoder 130 can compute a syndrome vector 412 (e.g., a 'syndrome') as shown in Equation 1.

$$\text{Syndrome} = H \cdot z, \text{ where } z \text{ represents the received bit vector} \quad \text{Equation 1: LDPC Syndrome}$$

For example, the received bit vector $z$ may represent a noisy version of encoded data written or stored to the channel, such as solid-state or magnetic storage media. A weight of the syndrome vector may be referred to as the syndrome weight, which can be calculated as a sum of the syndrome vector entries, which are 0s and 1s. As shown in FIG. 4, each circular node corresponds to an encoded bit or a variable node 408. A number of lines between one variable node 408 and a square check node 410 can be called a "type of bit", which may also be referred to as degree of bit-node (or degree of variable-node). This type of bit or degree of bit-node equals a number of 1s in each column of the parity check matrix H 402 that corresponds to the Tanner graph 404. For example, as shown in FIG. 4, the variable node 408 (leftmost) connects with two lines to respective check nodes 410, meaning this variable node is a type-2 (degree-2) node, and the number of 1s in the 1st column of the parity check matrix H is two. The next variable node connects with three lines to respective check nodes 410, meaning it is a type-3 (degree-3) node, and the number of 1s in the 2nd column of the parity check matrix H is 3. Generally, aspects of RL-enabled LDPC encoding may relate or be of interest for LDPC codes that may have one, two, or three or more different bit types, such that the methodology described herein may apply to all such LDPC code configurations. As shown at 414, when received or read bits are noisy, typically a syndrome vector for the bits is a non-zero vector and a syndrome weight is greater than 0. Alternatively, when the received or read bits are without any noise, the syndrome vector is a zero vector (e.g., entries are zeros) and the syndrome weight is 0. In aspects, the RL-enabled LDPC decoder 130 may interactively process (e.g., flip bits) noisy bits of data or a codeword until the syndrome 412 or the syndrome weight of the codeword approaches zero, meaning that errors in the received or read bits have been corrected.

Figure 5:
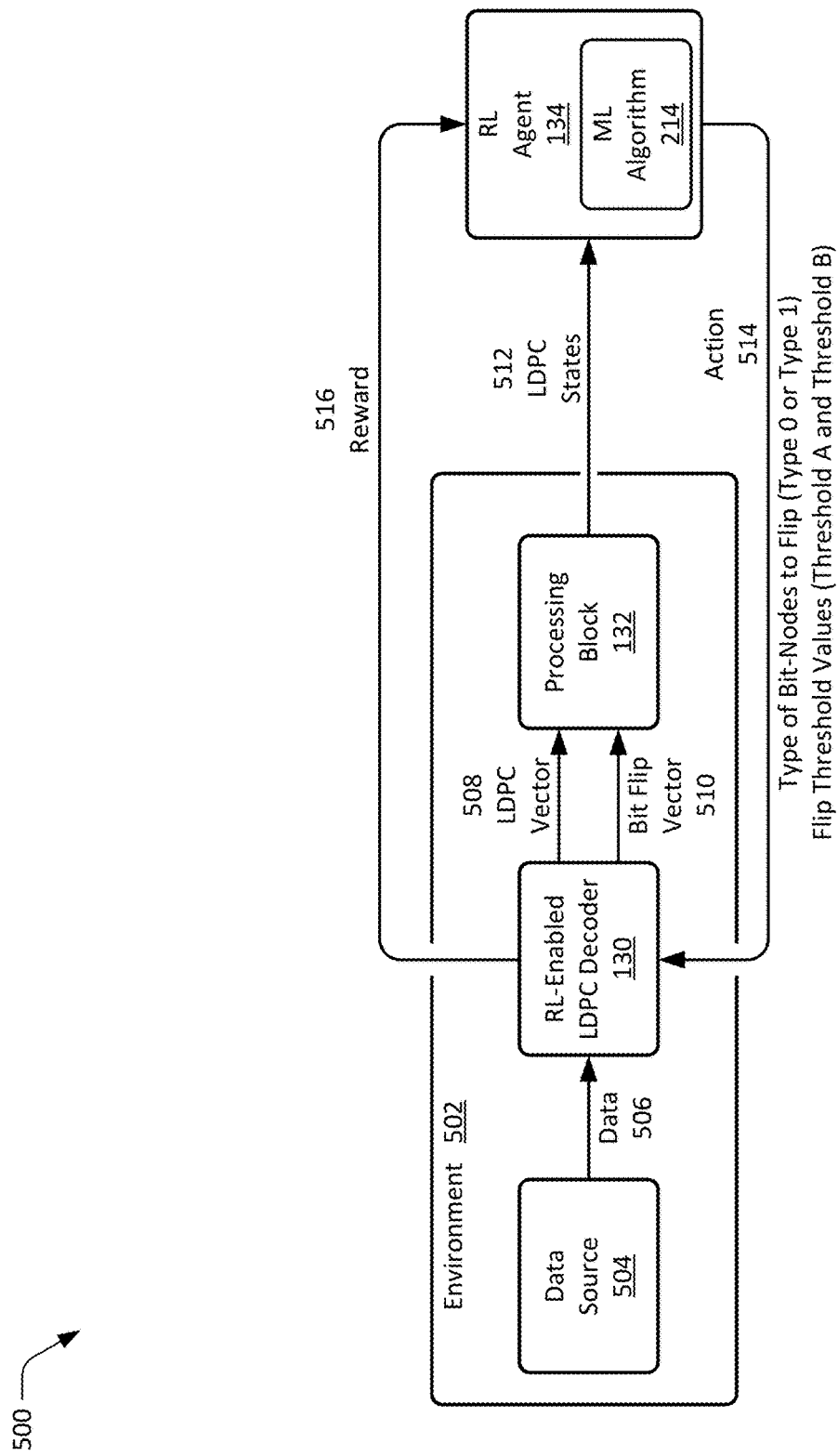
FIG. 5 illustrates an example environment in which an RL-enabled LDPC decoder may be trained and/or employed in accordance with various aspects.

FIG. 5 illustrates at 500 an example environment 502 in which an RL-enabled LDPC decoder may be trained and/or employed in accordance with various aspects. In aspects, reinforcement learning (RL) techniques for LDPC decoding are based at least in part on an ML algorithm implemented by the RL agent. The ML algorithm implemented by the RL agent can be, for example, a DDQN algorithm or a PPO algorithm. As described herein, the RL-enabled LDPC decoder may include a bit-flipping (BF) LDPC decoder or any other suitable type of LDPC decoder. In the context of FIG. 5, configuration and/or use of the RL-enabled LDPC decoder, RL agent, and ML algorithm generally includes defining an environment and ML parameters of the ML algorithm, training and optimizing the ML parameters to obtain or form a decision network, and RL-enabled LDPC decoding that is assisted by inference or evaluation by the decision network.

Generally, the environment 502 may be configured to define interaction between an RL-enabled LDPC decoder 130 and an ML algorithm 214 implemented by an RL agent 134. In aspects, ML parameters may include parameters of some known RL method or technique, such as a DDQN algorithm or PPO algorithm Training and optimization of the ML parameters to obtain a decision network may include an accumulation of experience of actions in the environment based on an RL optimization strategy. For example, the RL-enabled LDPC decoder 130 or the RL agent 134 may store the experience in a replay buffer. For optimization, an exploration and/or exploitation approach may be implemented, such as employing an c-greedy exploration during training and optimization of the ML algorithm. As an example, samples in the replay buffer of the decoder or environment can be used to optimize a neural network (e.g., DDQN) to obtain or form a decision network. As described with reference to FIG. 5, the environment of the RL-enabled LDPC decoder 130 may include a state space, an action space, and a reward function (r).

Generally, training or optimization of an RL-enabled LDPC decoder and/or RL agent may be represented as a time-invariant Markov decision process (MDP), or optimization in an environment whose state transitions are affected by actions taken by an agent, where each action depends on previous events. In this example, various features of an RL-enabled LDPC decoder are shown in the context of a bit-flipping decoding process, although the described aspects may be applied to any suitable type of LDPC-based decoding process (e.g., flooding, layered). In aspects, the RL-enabled LDPC decoder 130 may implement RL-based techniques for LDPC decoding based at least in part on parameters or information provided by an ML algorithm 214 of the RL agent 134. The ML algorithm 214 may be implemented as or include any suitable type of machine learning algorithm, which may include a DQN algorithm, a DDQN algorithm, a DDPG algorithm, a PPO algorithm, or the like. The RL-enabled LDPC decoder can be configured as a bit-flipping (BF) LDPC decoder or another suitable type of LDPC decoder that can interact with an RL agent to implement aspects of RL-enabled LDPC decoding.

In some aspects, the configuration and implementation of the RL-enabled LDPC decoder 130 may include multiple steps or phases that include interactions with various entities. For example, the environment 502 and parameters may be defined for the RL-enabled LDPC decoder and ML algorithm, the ML algorithm may be trained or optimized to form or obtain a decision network, and the RL-enabled LDPC decoder and ML algorithm may be deployed for inference or evaluation as part of a decoding process. In some implementations, an environment may include a state space, action space, and reward function (e.g., function r), which are described in detail with reference to the example environment 502.

As shown in FIG. 5, the environment 502 includes a data source 504, an instance of the RL-enabled LDPC decoder 130, and a processing block 132. The data source may include or represent any suitable source of encoded data, such as a data generator, a demodulator, a storage controller, a read channel, or the like. Generally, the data source 504 provides data 506 to the RL-enabled LDPC decoder 130 for decoding to provide decoded information. The inputs of the RL-enabled LDPC decoder 130 may also include a decoder result from a previous iteration, a type of bit-nodes to flip, or one or more thresholds, which may include a threshold for un-flipped bits (e.g., threshold A) and a threshold for flipped bits (e.g., threshold B). Based on at least a partial iteration of decoding, the RL-enabled LDPC decoder 130 provides decoding results, which in this example include an LDPC vector 508 and a bit flip vector 510, to the processing block 132. Alternatively or additionally, outputs of the RL-enabled LDPC decoder 130 can include decoding results from a current decoding iteration, an LDPC syndrome weight, an LDPC vector (e.g., a vector indicating for each bit-node a number of unsatisfied checks), or a bit flip vector (e.g., a vector indicating for each bit-node whether the bit was flipped or not), any of which may be provided to the processing block 132 and/or the RL agent 134.

In aspects, the processing block 132 receives information from the RL-enabled LDPC decoder 130, which may include the LDPC vector 508 and the bit flip vector 510. Generally, the processing block 132 can receive any relevant information from the RL-enabled LDPC decoder 130. In some cases, the processing block 132 receives information from the RL-enabled LDPC decoder 130 for each iteration performed by the decoder. In some implementations, the LDPC information is received in vector form (e.g., LDPC vector), which may include or correspond to a number of unsatisfied checks vector (NUC vector) for each bit-node or for each group of bit-nodes (e.g., bits of a codeword) in the LDPC decoder. In aspects, the processing block 132 may translate the LDPC vector 508 (or NUC vector) and the bit flip vector 510 into LDPC states 512, which may include NUC states, where a NUC state can indicate the number of unsatisfied checks for a bit-node or a group of bit-nodes.

Figure 6:
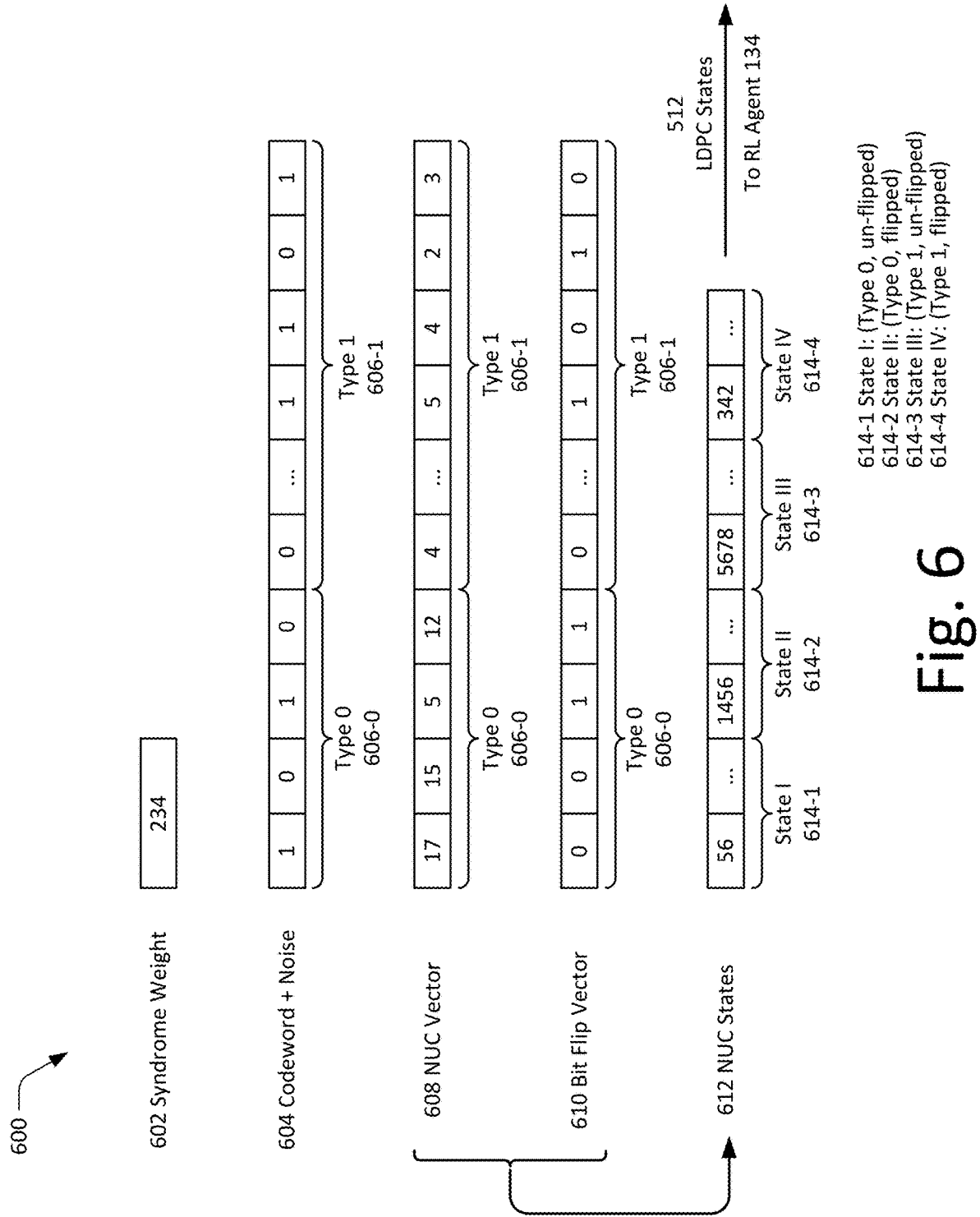
FIG. 6 illustrates an example of LDPC state information that an RL-enabled LDPC decoder and/or processing block may provide.

By way of example, consider FIG. 6 which illustrates at 600 an example of LDPC state information that an RL-enabled LDPC decoder and/or processing block may provide. In aspects, the RL-enabled LDPC decoder 130 or processing block 132 may implement the LDPC state information in any suitable format, such as the formats or formulations as shown in FIG. 6 as examples of weight, a codeword, vectors, and/or states. The implementations of FIG. 6 are presented as one example, where different definitions or formulations of the LDPC states are possible, based on a particular structure or configuration of an LDPC decoder. In the context of FIG. 6, the RL-enabled LDPC decoder 130 and/or processing block 132 may implement at least a portion of a decoding iteration or step to provide LDPC state information 512 to the RL agent 134.

In various implementations, the RL-enabled LDPC decoder can determine a syndrome weight 602 based on or for codewords 604 (e.g., codeword plus channel noise). In aspects, bit-nodes or variable nodes of the codewords 604 can be identified or classified by type, which may correspond to a number of neighboring check nodes to which each bit-node or variable node is linked. For example, type 0 bit-nodes 606-0 may correspond to bit-nodes with two neighboring check nodes (e.g., node connections of FIG. 4), type 1 bit-nodes 606-1 may correspond to bit-nodes with three neighboring check nodes, and so forth. For the sake of brevity, FIG. 6 is described with reference to two types of bit-nodes, although the concepts of the types, thresholds, and states may be applied to any number of bit-node types defined for an LDPC decoder.

In aspects, the RL-enabled LDPC decoder 130 determines or generates a number-of-unsatisfied-checks vector 608 (NUC vector 608) and a bit flip vector 610 for a codeword 604. Generally, the NUC vector represents a number of unsatisfied checks for a bit-node (or bit) and the bit flip vector indicates whether the bit-node (or bit) is flipped or not flipped, such as during a current decoding iteration. Based on the NUC vector 608 and bit flip vector 610 the decoder 130 or processing block 132 determines NUC states 612, which may be provided to the RL agent 134 as the LDPC state information 512. Based on a number of bit types and vectors, the RL-enabled LDPC decoder 130 and/or processing block 132 may generate any number of states. In the context of the current example, a state value may be defined as value: (Type, Flip/Non-Flip, NUC), such that with two types of bit-nodes, four different states may be defined for the LDPC information, including State I: (Type 0, un-flipped) 614-1, State II: (Type 0, flipped) 614-2, State III: (Type 1, un-flipped) 614-3, and State IV: (Type 1, flipped) 614-4.

Returning to FIG. 5, the processing block 132 provides the LDPC states 512 to the RL agent 134, which may include one or more ML algorithms 214. Generally, training of the ML algorithm operates in different episodes. An episode (or each episode) may include several steps or iterations. In each step (or iteration), the environment 502 interacts with the RL agent 134, such as shown in FIG. 5 (e.g., LDPC states 512, action 514, and/or reward 516). A number of steps of an episode may have a maximum value, and when such a value is encountered, the iteration process for the episode will be terminated. For example, a step may represent processing all the bit-nodes in the RL-enabled LDPC decoder 130 once, the step may represent processing all of the bit-nodes in the RL-enabled LDPC decoder 130 multiple times, or the step may represent processing a portion or fraction (not all) of the bit-nodes in the RL-enabled LDPC decoder 130 one time. Thus, a step of the training episode may represent processing some or all check nodes in the decoder once or multiple times. As described with reference to FIG. 6, the environment 502 may pass or provide the LDPC states 512 (e.g., NUC states) to the RL agent, such as part of a state space of the environment 502.

As described herein, the environment 502 of the RL-enabled LDPC decoder 130 may include a state space, an action space, and a reward function (r). In aspects, the RL agent 134 or ML algorithm 214 acts or provides action 514 to the RL-enabled LDPC decoder 130 based on the LDPC states 512 and/or outputs the decision network of the ML algorithm. The action 514 may include any suitable type of input, parameters, or feedback to the RL-enabled LDPC decoder 130, which may assist or aid the decoder in decoding data 506 from the data source 504. In the context of the present example, an action 514 provided by the RL agent 134 may include a bit-node type or a threshold, where the type is either Type 0 or Type 1 (for two total defined types) and respective bit flip thresholds, Threshold A and Threshold B. The defined types and thresholds may be expanded to any number of bit-nodes, for example, the possible types in the action 514 can be denoted as Type 0, Type 1, and Type 2 for three bit-node types.

In aspects, training of the ML algorithm 214 is based on the reward 516, which may be provided to the RL agent 134 to optimize values of the parameters of the ML algorithm Generally, the purpose of the RL-enabled LDPC decoder 130 and the associated method includes driving a syndrome weight of a codeword being decoded or processed to zero (e.g., zero unsatisfied checks for a bit or group of bits). In an example implementation, a reward function for the RL-enabled LDPC decoder 130 may be defined by adding an inverse of the syndrome weight in the reward function during the iterations. In other words, as the syndrome weight increases (greater number of unsatisfied checks) the more negative the reward 516 to the RL agent 134 becomes. Alternatively or additionally, the reward may be adjusted to a large positive value on decoding success in driving the syndrome weight to zero or a small value. For example, when the syndrome weight reaches zero, the reward 516 may be very large to indicate the achievement of a desired outcome for the action 514 provided by the ML algorithm 214. This is but one example of defining a reward 516 for the RL agent 134, any other suitable reward may be implemented, for example, those decisions or selections by the RL agent that drive the syndrome weight or a number of bit errors in the decoding process to a lower number (e.g., eventually to 0), can be utilized with the aspects described herein.

In aspects, an RL block may serve as an agent, such as the RL agent 134 as shown in FIG. 5. As described, inputs of the RL agent 134 may include LDPC states 512, which the RL agent 134 processes and provides actions 514 as an output set of parameters that can be utilized in the RL-enabled LDPC decoder 130. During training, in each episode, the RL agent 134 can determine whether a number of iterations reaches a preset threshold N or whether the decoding of the codeword was successful (e.g., syndrome weight of zero is reached). If so, the RL agent can jump out of a current training episode, otherwise the training process ends when the number of episodes reaches the preset threshold N, or if the convergence of the training behavior is observed (e.g. by observing the convergence of the reward function).

In the context of training the ML algorithm 214, any suitable gradient descent methods may be used to optimize the values of the parameters in the ML algorithm, such as to optimize the weights in a neural network (NN), such as DDQN weights. For example, in the optimization of DDQN, existing or "current NN" parameters can be optimized every time for some number of rounds (e.g., K rounds) and after every K rounds, the "current NN" parameters are copied to "target NN" parameters. After training, the target NN may be used as a decision network of the RL agent 134. As described herein, the NN can be implemented as any suitable neural network, with any number of layers. Alternatively or additionally, the NN may include or utilize any suitable activation function, which may be a non-linear activation function, including a rectified linear units (ReLU), though other types of activation functions, such as sigmoid or hyperbolic tangent, can be used.

Figure 7:
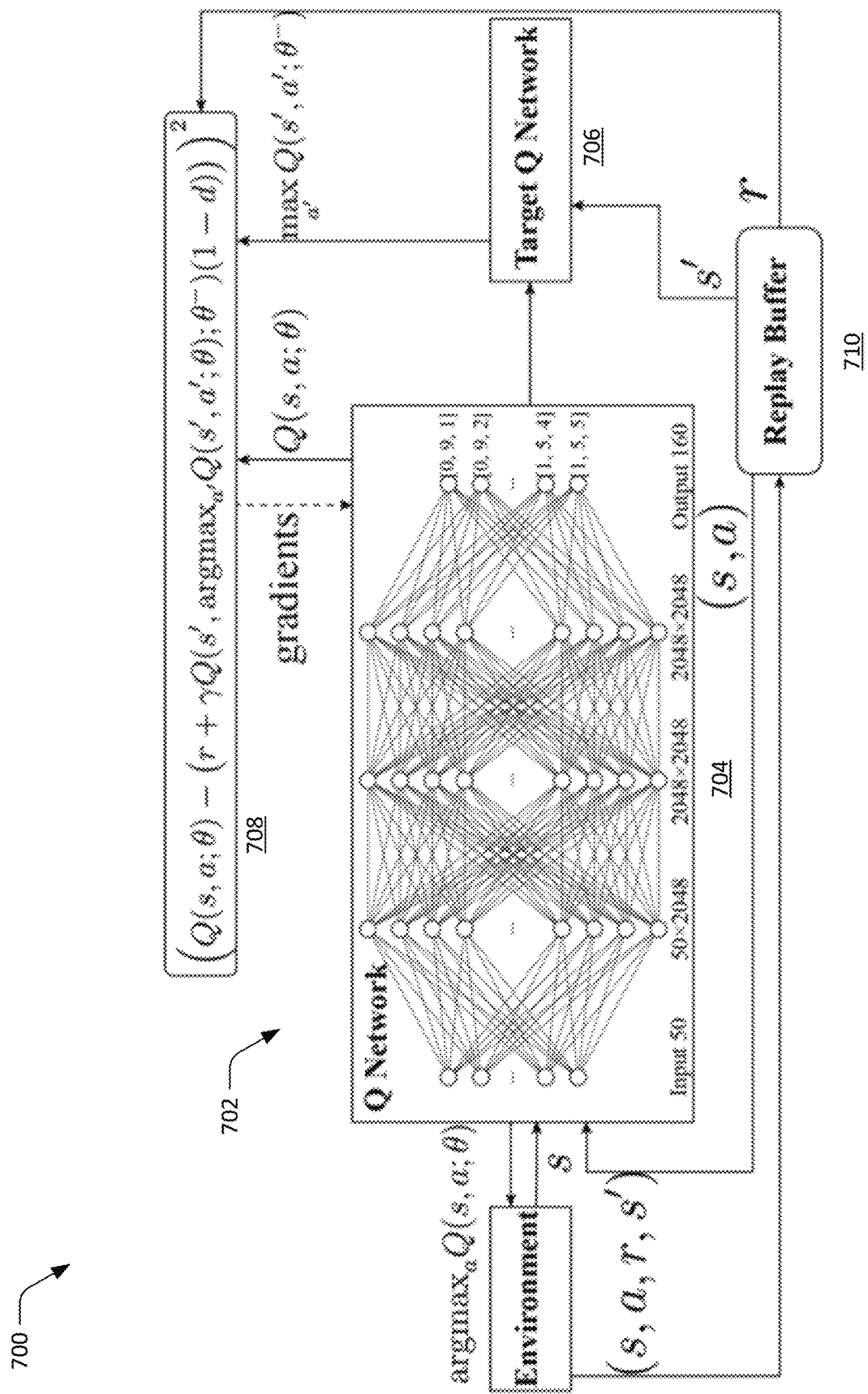
FIG. 7 illustrates an example neural network that an RL agent may implement in accordance with one or more aspects.

By way of example, consider FIG. 7 which illustrates at 700 an example neural network that an RL agent may implement in accordance with one or more aspects. In this example, the neural network is illustrated in the context of a Double-DQN (DDQN) flowchart 702, although any other type of RL or ML algorithms may be employed. The DDQN flowchart 702 includes "current NN" parameters 704 (Q-network parameters), "target NN" parameters 706 (target Q-network parameters), DDQN error function 708 and an instance of the replay buffer 710. Among them, the NN parameters may include the number of network layers, the number of nodes and connections in a layer, the NN weights, and/or the activation functions. As described herein, the RL agent 134 may include or have access to one or more ML algorithms 214 (or RL algorithms) that are configured or trained to assist with or optimize decoding by the RL-enabled LDPC decoder 130. In aspects, the RL agent 134 may be stored in a persistent storage media of the storage system, such as the storage media 124, an internal memory of the storage controller 126 (not shown), or memory of the decoder 130, processing block 132, or RL agent hardware. The RL agent 134 may include any suitable number of neural networks, which may be configured differently from or similar to one another.

Generally, an instance of an ML algorithm 214 associated with the RL agent 134 may be implemented with a deep neural network (DNN), a deep Q-network (DQN), a double-DQN (DDQN), a deep deterministic policy gradient (DDPG), or proximal policy optimization (PPO), or the like. In aspects, the ML algorithm may be implemented as a deep neural network (DNN) that includes an input layer, an output layer, and one or more hidden intermediate layers positioned between the input layer, pre-input layer (e.g., embedding and/or averaging network), and the output layers of the neural network. Each node of the deep neural network may in turn be fully connected or partially connected between the layers of the neural network. An ML algorithm 214 or neural network may be any deep neural network (DNN), such as a convolutional neural network (CNN) including one of AlexNet., ResNet, GoogleNet, MobileNet, or the like. Alternatively or additionally, an ML algorithm 214 may include any suitable recurrent neural network (RNN) or any variation thereof. Generally, a neural network, ML algorithm, or AI model employed by the RL agent 134 may also include any other supervised learning, unsupervised learning, reinforcement learning algorithm, or the like.

In various aspects, an ML algorithm 214 may be implemented as a recurrent neural network with connections between nodes forming a cycle to retain information from a previous portion of an input data sequence for a subsequent portion of the input data sequence (e.g., respective characteristics or parameters of LDPC decoding iterations). Alternately, an ML algorithm 214 may be implemented as a feed-forward neural network having connections between the nodes that do not form a cycle between input data sequences. In yet other cases, an ML algorithm 214 of the RL agent 134 may include a convolutional neural network (CNN) or multilayer perceptrons where each neuron in a given layer is connected with all neurons of an adjacent layer. In some aspects, an ML algorithm 214 is based on a convolutional neural network that may be applied to previous iterations of LDPC decoding to generate bit-node types and/or thresholds for subsequent LDPC decoding operations. Alternately or additionally, the ML algorithm 214 may include or utilize various regression models, such as multiple linear regression models, a single linear regression model, logistical regression models, stepwise regression models, multi-variate adaptive regression models, locally estimated scatterplot models, or the like.

After training and optimization of the RL agent 134 and/or the ML algorithm 214 is complete, the RL-enabled LDPC decoder 130 may interact with the ML algorithm to perform the inference. The training of the RL agent 134 and ML algorithm 214 can be implemented offline, such as prior to deployment of the RL-enabled LDPC decoder 130. Alternatively, the training of the RL agent 134 and ML algorithm 214 may include at least some online training, in which the RL agent 134 may update parameters of the ML algorithm based on LDPC decoding performed in the field. Thus, in some implementations, the RL agent 134 stores and "freezes" some or all of the parameters of the ML algorithm 214. These parameters may include, for example, respective weights of one or more NN layers, such as the weights of the decision network (e.g., target Q-network of DDQN). Generally, the frozen parameters may include any suitable parameters of a selected ML or RL algorithm, such as the selected ML algorithm 214 in the RL agent 134. In aspects, these stored parameters are utilized to implement the inference steps with the RL-enabled LDPC decoder 130.

For example, one inference step may include the RL-enabled LDPC decoder 130 providing LDPC states 512 or LDPC state information to the RL agent 134 (or RL block). The RL agent 134 can then run the operation with the frozen parameters and provide outputs (e.g., Thresholds A, B for bit-node Types 0 and 1) as actions 514 to the RL-enabled LDPC decoder 130. In aspects, the inference process can operate in multiple (iterative) stepwise fashion in which each step may refer to one step in the RL agent 134 and processing of some or all LDPC bit-nodes in the decoder one time or multiple times. Alternatively or additionally, one step or one iteration may include processing some or all LDPC check-nodes in the decoder one time or multiple times. By so doing, the RL agent 134 may provide parameters to the RL-enabled LDPC decoder 130 to improve decoding performance, such as by reducing a number of iterations performed to decode a codeword of noisy data.

Techniques for RL-Enabled LDPC Decoding

The following discussion describes techniques for RL-enabled LDPC decoding, which may enable an LDPC decoder to decode channel data in fewer decoding iterations or with a higher success rate, thereby improving LDPC decoding performance. These techniques may be implemented using any of the environments and entities described herein, such as the RL-enabled LDPC decoder 130, processing block 132, and/or RL agent 134. These techniques include various methods illustrated in FIGS. 8-11, each of which is shown as a set of operations that may be performed by one or more entities.

These methods are not necessarily limited to the orders of operations shown in the associated figures. Rather, any of the operations may be repeated, skipped, substituted, or re-ordered to implement various aspects described herein. Further, these methods may be used in conjunction with one another, in whole or in part, whether performed by the same entity, separate entities, or any combination thereof. For example, the methods may be combined to implement RL-enabled LDPC decoding to adaptively set parameters (e.g., bit flip thresholds) of an RL-enabled LDPC decoder to decode channel data in fewer decoding iterations or with a higher success rate, thereby improving LDPC decoding performance. In portions of the following discussion, reference will be made to the operating environment 100 of FIG. 1 and various entities or configurations of FIGS. 2-7 by way of example. Such reference is not to be taken as limiting described aspects to the operating environment 100, entities, or configurations, but rather as illustrative of one of a variety of examples. Alternately or additionally, operations of the methods may also be implemented by or with entities described with reference to the System-on-Chip of FIG. 12 and/or the storage system controller of FIG. 13.

Figure 8:
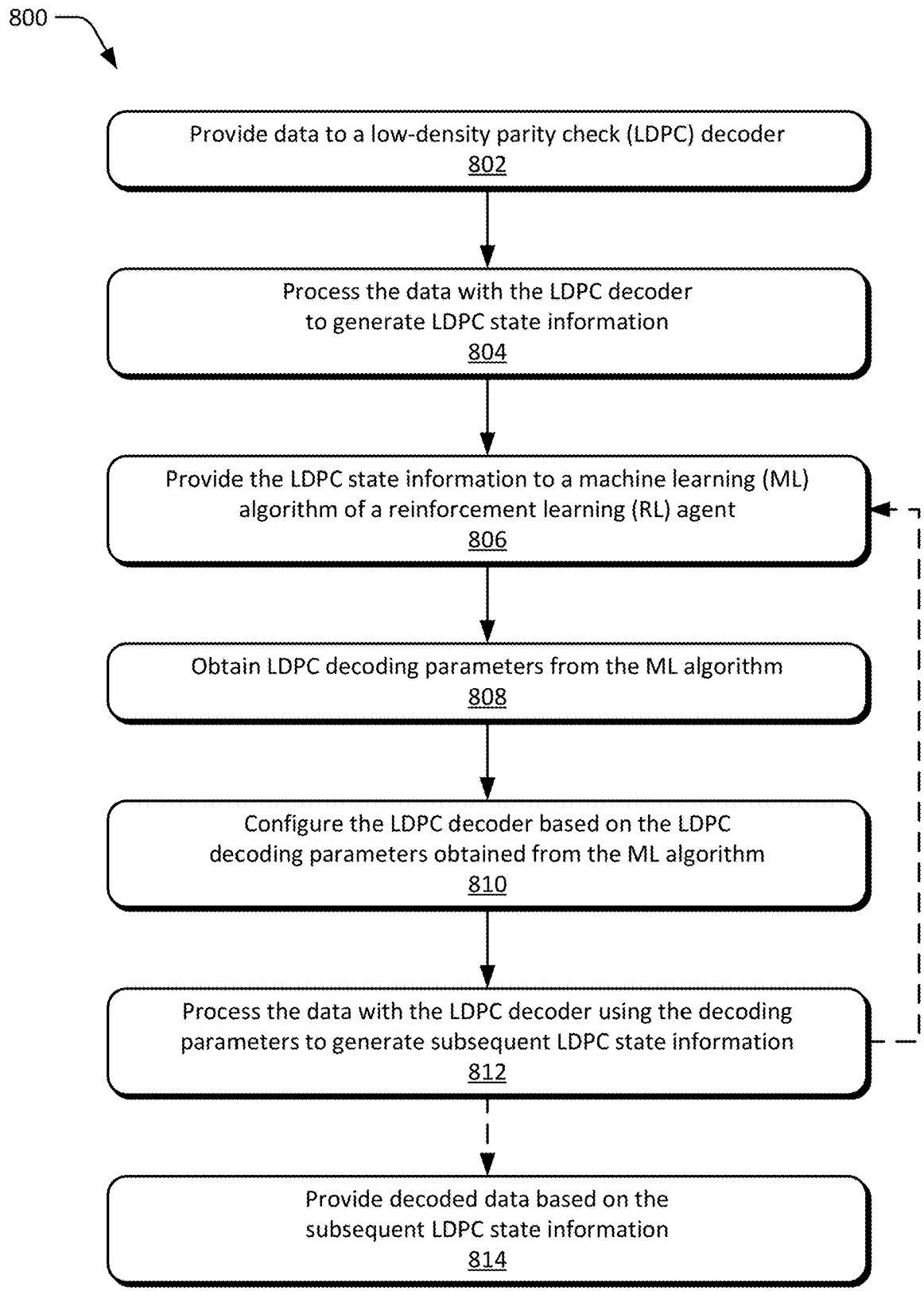
FIG. 8 depicts an example method for RL-enabled LDPC decoding in accordance with one or more aspects.

FIG. 8 depicts an example method 800 for RL-enabled LDPC decoding, including operations performed by or with an RL-enabled LDPC decoder 130, a processing block 132, or RL agent 134 associated with the RL-enabled LDPC decoder.

At 802, data is provided to an LDPC decoder, which can be configured as an RL-enabled LDPC decoder. The data may be received from a channel, such as a storage channel or a communication channel. For example, the data may be received from a storage channel via a storage media interface or from a communication channel via a transceiver. Due to noise in the channel, one or more bits of the data (e.g., one or more bits of a data codeword) may be flipped or incorrect. Thus, the bits of the received data or read data may include flipped bits or bit errors in an ECC coding of the data.

At 804, the LDPC decoder processes the data to generate LDPC state information. The LDPC state information may include any suitable type of LDPC information, which may include a decoding result of a previous iteration of decoding, an LDPC vector for a bit of the data being decoded, a bit flip vector for a bit of the data being decoded, a syndrome weight for the data being decoded, a number of unsatisfied checks for a bit of the data being decoded, or the like. In some cases, the processing includes processing the data as part of a first decoding iteration in which the LDPC decoder flips a bit value of a variable node representative of a corresponding bit in the data.

At 806, the LDPC state information is provided to an ML algorithm of an RL agent associated with the decoder. The ML algorithm may include a preconfigured or pre-trained ML algorithm configured to provide LDPC decoding parameters, such as bit flip thresholds or other decision criteria for the RL-enabled LDPC decoder. The ML algorithm may include any suitable type of ML algorithm, which may include a DNN, a DQN, a DDQN, a DDPG, a PPO, or the like.

At 808, LDPC decoding parameters are obtained from the ML algorithm of the RL agent. The LDPC decoding parameters may include any parameter or decision criteria useful to aid the LDPC decoder in decoding the codeword of data. For example, the LDPC decoding parameters may include a value of an LDPC decision threshold, a value of bit flip threshold, an adjustment of a bit flip threshold, a type of bit-node to flip, a type of bit-node to process during a subsequent iteration of decoding, or the like. At 810, the LDPC decoder is configured with the LDPC decoding parameters obtained from the ML algorithm In some cases, thresholds of the LDPC decoder are adjusted or the LDPC decoder is configured to process a particular type of bit-node during a subsequent iteration of decoding.

At 812, the LDPC decoder processes the data using the decoding parameters to generate subsequent LDPC state information. In some cases, the LDPC decoder flips one or more bits in the data based on updated decoding parameters to generate the subsequent LDPC state information. This processing of the data, such as part of a second decoding iteration with the LDPC decoder, may include flipping a bit value of a variable node representative of a corresponding bit in the data. The bit flipped during the second iteration of the decoding process may be different from the bit flipped during the first or a previous iteration of the decoding process. The subsequent LDPC state information may include any suitable type of state information, such as another decoding result of the current iteration of decoding, another LDPC vector for a bit of the data being decoded, another bit flip vector for a bit of the data being decoded, another syndrome weight for the data being decoded, an updated number of unsatisfied checks for a bit of the data being decoded, or the like.

From operation 812, the method 800 may proceed to operation 814 at which data of the decoded codeword is provided based on the subsequent LDPC state information or return to operation 806 to implement another iteration of decoding. By implementing the method 800, an RL-enabled LDPC decoder may be implemented to improve decoding performance, such as by reducing a number of iterations performed to decode a codeword of noisy data.

Figure 9:
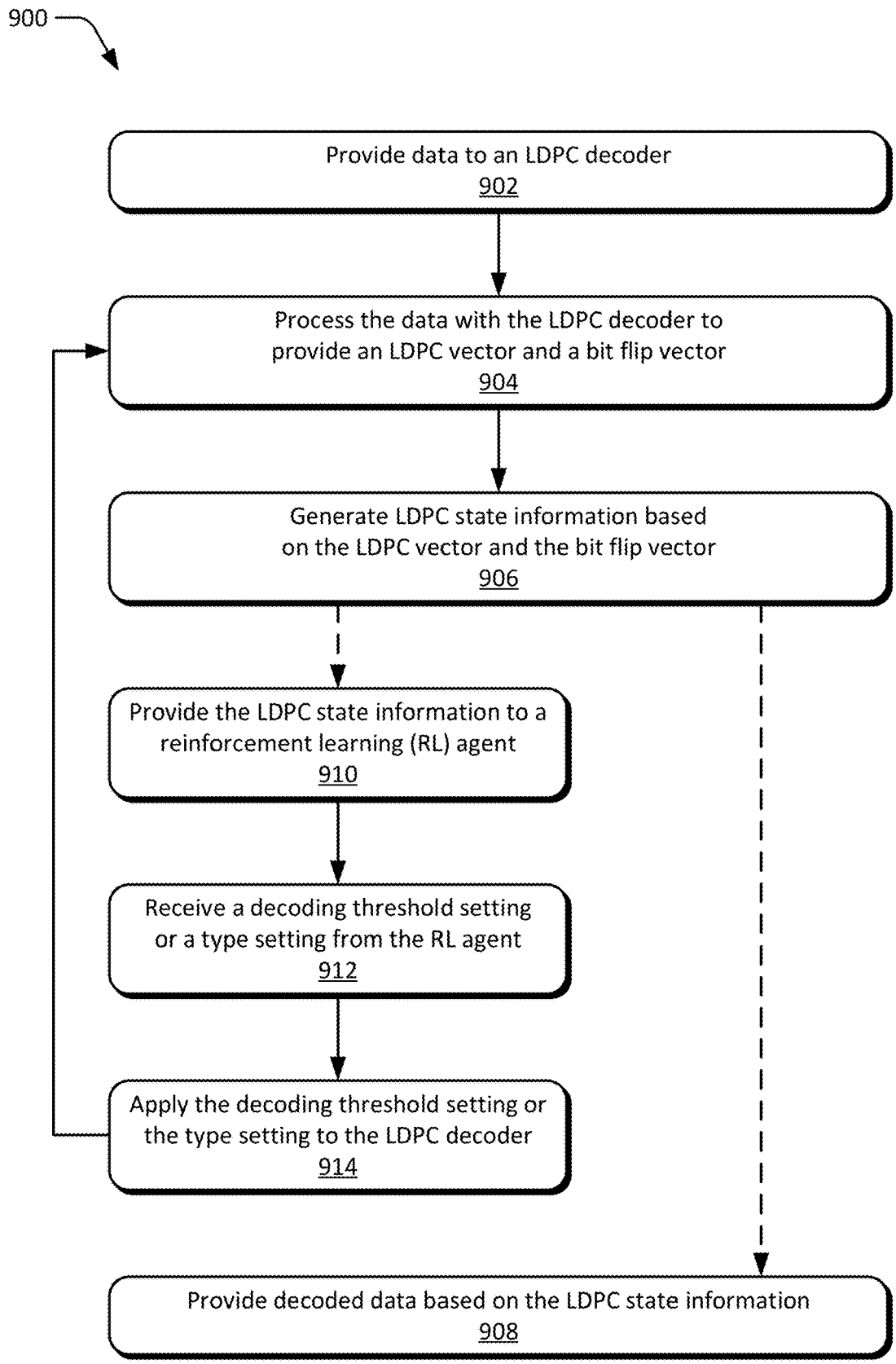
FIG. 9 depicts an example method for implementing RL-enabled decoding with an LDPC bit-flipping decoder.

FIG. 9 depicts an example method 900 for implementing RL-enabled decoding with an LDPC bit-flipping decoder, including operations performed by or with an RL-enabled LDPC decoder 130, a processing block 132, or RL agent 134 associated with the RL-enabled LDPC decoder.

At 902, data is provided to an LDPC decoder, which is configured as an RL-enabled LDPC decoder. The data may be received from a channel, such as a storage channel or a communication channel Due to noise in the channel, one or more bits of the data (e.g., one or more bits of a data codeword) may be flipped or incorrect.

At 904, the LDPC decoder processes the data to provide an LDPC vector and a bit flip vector. Alternatively or additionally, the LDPC decoder may provide other outputs, which may include a decoding result of a previous iteration of decoding, a syndrome weight for the data being decoded, a number of unsatisfied checks for a bit of the data being decoded, or the like.

At 906, a processing block associated with the LDPC decoder generates LDPC state information based on the LDPC vector and the bit flip vector. The LDPC state information may include a syndrome weight or NUC states (e.g., FIG. 6) for the data being decoded. From operation 906, the method 900 may proceed to operation 908 at which decoded data is provided by the decoder based on LDPC state information or to operation 910 at which the LDPC state information is provided to an RL agent.

At 910, the LDPC state information is provided to an RL agent associated with the decoder. For example, the syndrome weight or the NUC states may be provided to an ML algorithm of the RL agent. Alternatively or additionally, the LDPC decoder may provide a decoding result of a previous iteration of decoding, a number of unsatisfied checks (e.g., NUC value or vector) for a bit of the data being decoded, or the like.

At 912, the decoder receives a decoding threshold setting or a type setting from the RL agent. For example, the decoder may receive bit flip thresholds or settings to operate on a particular bit-node types during a decoding iteration or step, such as the Threshold A, Threshold B for bit-node Types 0 and 1 as described with reference to FIG. 5 and FIG. 6. At 914, the decoding threshold setting or the type setting is applied to the LDPC decoder, at which point the method 900 may return to operation 904 to implement another decoding iteration or step. Based on the results of the subsequent decoding iteration or step, the LDPC decoder may proceed to operation 910 to interact with the RL agent or provide decoded data at operation 908.

Figure 10:
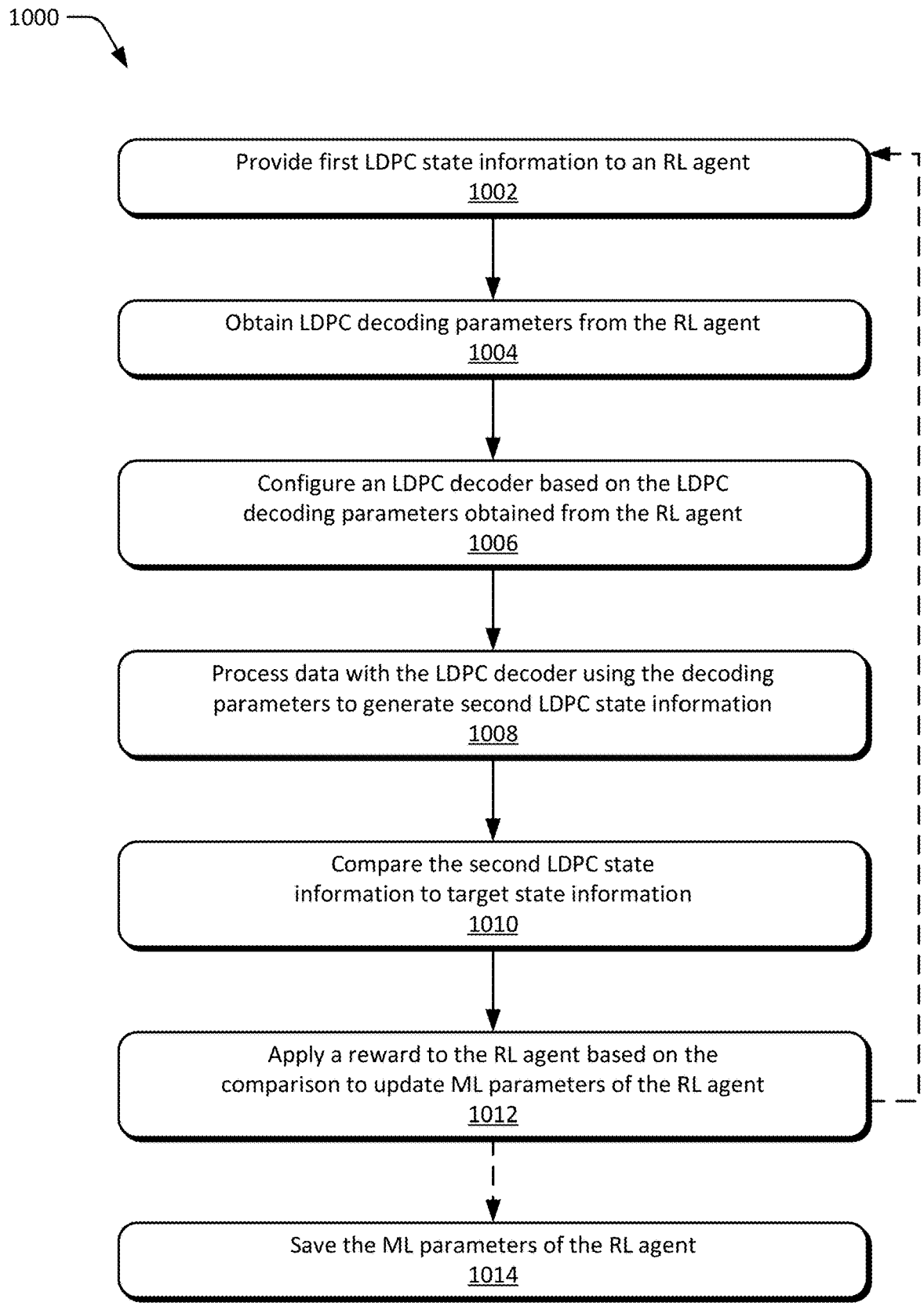
FIG. 10 depicts an example method for training an RL-enabled LDPC decoder.

FIG. 10 depicts an example method 1000 for training an RL-enabled LDPC decoder, including operations performed by or with an RL-enabled LDPC decoder 130, a processing block 132, or RL agent 134 associated with the RL-enabled LDPC decoder.

At 1002, first LDPC state information is provided to an RL agent or an ML algorithm of the RL agent. The LDPC state information may include any output of an LDPC decoder, such as a decoding result of a previous iteration of decoding, an LDPC vector for a bit of the data being decoded, a bit flip vector for a bit of the data being decoded, a syndrome weight for the data being decoded, a number of unsatisfied checks for a bit of the data being decoded, or the like.

At 1004, LDPC decoding parameters are obtained from the RL agent. The LDPC decoding parameters may include any parameter or decision criteria useful to aid the LDPC decoder in decoding the codeword of data. For example, the LDPC decoding parameters may include a value of an LDPC decision threshold, a value of bit flip threshold, an adjustment of a bit flip threshold, a type of bit-node to flip, a type of bit-node to process during a subsequent iteration of decoding, or the like.

At 1006, an LDPC decoder is configured based on the LDPC decoding parameters obtained from the RL agent. In some cases, thresholds of the LDPC decoder are adjusted or the LDPC decoder is configured to process a particular type of bit-node during a subsequent iteration of decoding.

At 1008, the LDPC decoder processes the data using the decoding parameters to generate second LDPC state information. The second LDPC state information may be different from the first LDPC state information due to the updated configuration of the LDPC decoder and/or the subsequent decoding iteration in which different ones of the bits being decoded may be flipped by the LDPC decoder.

At 1010, the second LDPC state information is compared to target state information for the decoding process. For example, the second LDPC state information may be compared to previous iterations of LDPC state information to determine whether the decoding process is progressing (e.g., decreasing syndrome weight) or regressing (e.g., increasing syndrome weight). Alternatively or additionally, the second LDPC state information may be compared to an end state for which the RL agent is being trained, such as a syndrome weight of zero or a NUC value or NUC vector of zero.

At 1012, a reward is applied or provided to the RL agent based on the comparison of LDPC state information to update ML parameters of the RL agent. For example, if the syndrome weight (or NUC values) of the decoding process increases, a negative reward based on the increase in syndrome weight can be applied to the ML algorithm of the RL agent. Alternatively, if the syndrome weight (or NUC values) of the decoding process decreases, a positive reward based on the decrease in syndrome weight can be applied to the ML algorithm of the RL agent. From operation 1012, the method 1000 may return to operation 1002 to initiate another episode or step of the training process for the RL agent. Alternatively, when training is complete (e.g., a predefined number of training episodes finish), the method 1000 may advance to operation 1014 at which the ML parameters of the RL agent are saved for use in inference or evaluation of the ML algorithm when applied during the LDPC decoding process.

Figure 11:
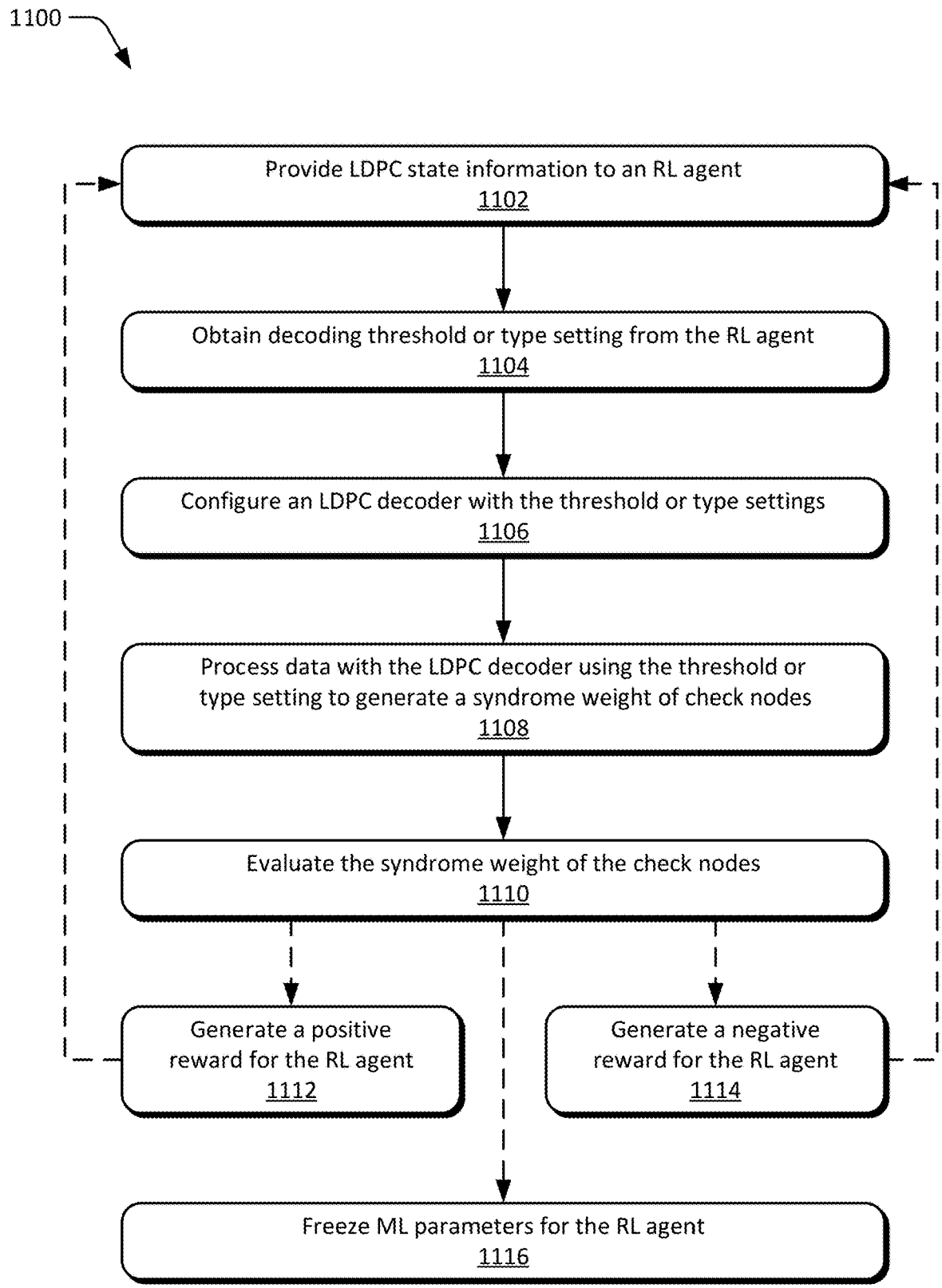
FIG. 11 depicts an example method for syndrome-based training of an RL-enabled LDPC decoder.

FIG. 11 depicts an example method 1100 for syndrome-based training of an RL-enabled LDPC decoder, including operations performed by or with an RL-enabled LDPC decoder 130, a processing block 132, or RL agent 134 associated with the RL-enabled LDPC decoder.

At 1102, LDPC state information is provided to an RL agent associated with an LDPC decoder. For example, the LDPC decoder or a processing block may provide syndrome weights, a NUC vector, bit flip vector, or the like to the RL agent.

At 1104, a decoding threshold or a type setting is obtained from the RL agent based on the LDPC state information provided. In aspects, the RL agent may process the LDPC state information using an ML algorithm to determine a bit-node type setting or threshold for the LDPC decoder. Alternatively or additionally, the RL agent may provide one or more of a value of an LDPC decision threshold, a value of bit flip threshold, an adjustment of a bit flip threshold, a type of bit-node to flip, or a type of bit-node to process during a subsequent iteration of decoding.

At 1106, the LDPC decoder is configured with the threshold setting or the type setting provided by the RL agent. As described herein these settings may include bit flip thresholds or settings to operate on a particular bit-node type during a decoding iteration or step, such as the Threshold A, Threshold B for bit-node Types 0 and 1 as described with reference to FIG. 5 and FIG. 6.

At 1108, the LDPC decoder processes the data or performs another decoding iteration on the data using the threshold setting or type setting to generate a syndrome weight of check nodes. Generally, this syndrome weight (or NUC vector) may be different from the syndrome weight of a previous iteration due to the updated configuration of the LDPC decoder and/or the subsequent decoding iteration in which different ones of the bits being decoded may be flipped by the LDPC decoder.

At 1110, the syndrome weight of the check nodes is evaluated against a target threshold, such as zero. At 1112, a positive reward for the RL agent is generated in response to a decrease in the syndrome weight. For example, when the syndrome weight (or NUC values) of the decoding process decreases, a positive reward based on the decrease in syndrome weight is applied to the ML algorithm of the RL agent. Alternatively, at 1114, a negative reward for the RL agent is generated in response to an increase in the syndrome weight. For example, when the syndrome weight (or NUC value) of the decoding process increases, a negative reward based on the increase in syndrome weight is applied to the ML algorithm of the RL agent. From operation 1112 or operation 1114, the method 1100 returns to operation 1102, from which the method may implement another step or episode of RL training to form a decision network of the RL agent. When training of the ML algorithm of the RL agent is complete, such as when a predefined number of episodes are complete or when decoding is successful, the method 1100 may advance to operation 1116, at which point the ML parameters for the RL agent are frozen. The frozen parameters of the RL agent may then be used when inference or evaluation is performed with the ML algorithm during LDPC decoding, such as when the RL-enabled LDPC decoder decodes codewords of data read from a storage media or received through a communication channel.

System-On-Chip and Controller

Figure 12:
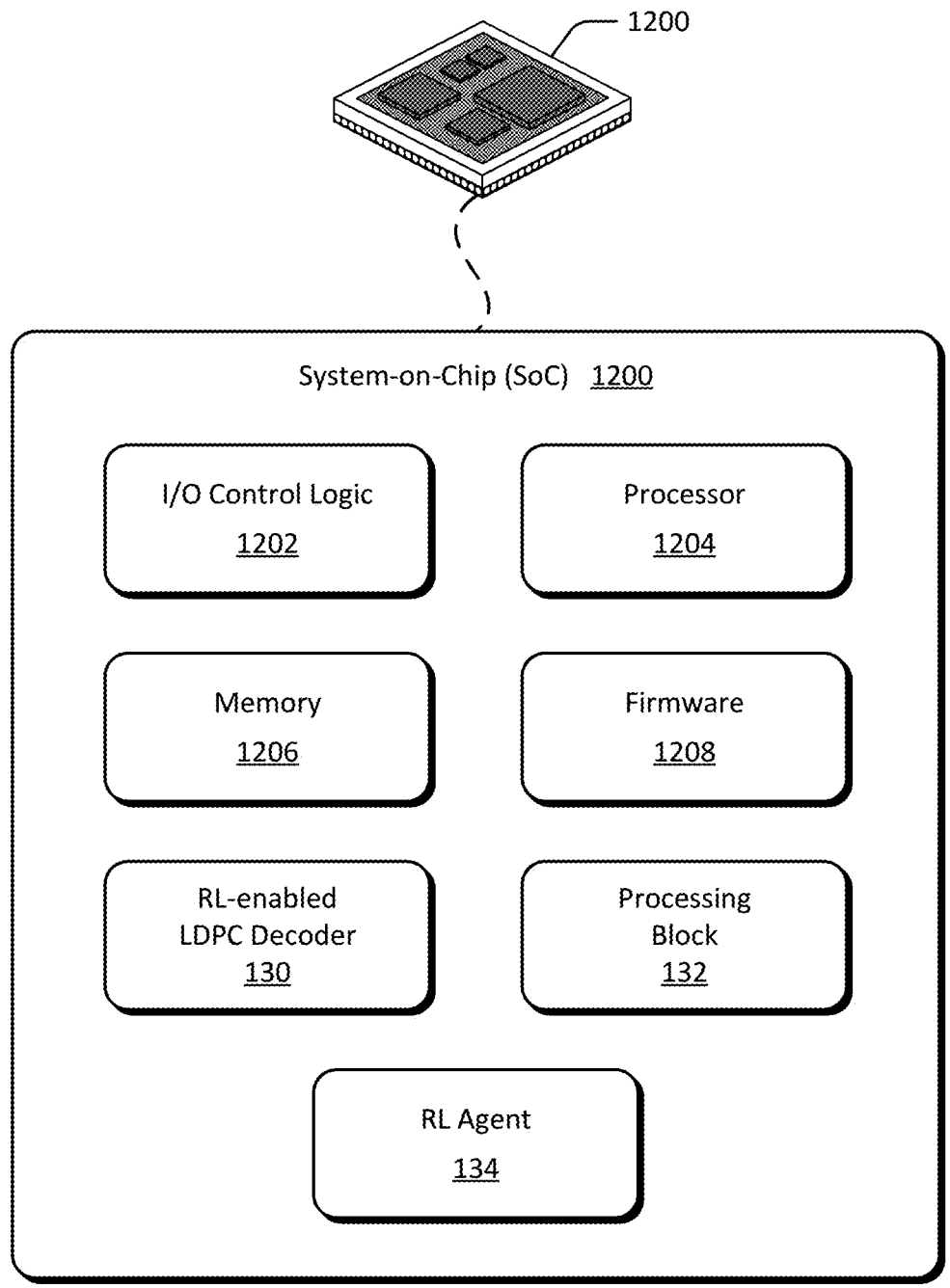
FIG. 12 illustrates an example System-on-Chip (SoC) environment in which aspects of RL-enabled LDPC decoding may be implemented.

FIG. 12 illustrates an example System-on-Chip (SoC) 1200 environment in which various aspects of RL-enabled LDPC decoding may be implemented. The SoC 1200 may be implemented in any suitable system or device, such as a smart-phone, a netbook, a tablet computer, an access point, a network-attached storage device, a camera, a smart appliance, a printer, a set-top box, a server, a data storage center, a solid-state drive (SSD), a hard disk drive (HDD), an optical storage drive, a holographic storage system, a storage drive array, a memory module, an automotive computing system, or an aggregate storage controller, or any other suitable type of device (e.g., others described herein). Although described with reference to an SoC, the entities of FIG. 12 may also be implemented as other types of integrated circuits or embedded systems, such as an application-specific integrated-circuit (ASIC), memory controller, storage controller, communication controller, application-specific standard product (ASSP), digital signal processor (DSP), programmable SoC (PSoC), system-in-package (SiP), or field-programmable gate array (FPGA).

The SoC 1200 may be integrated with electronic circuitry, a microprocessor, memory, input-output (I/O) control logic, communication interfaces, firmware, and/or software useful to provide functionalities of a computing device, host system, or storage system, such as any of the devices or components described herein (e.g., storage drive or storage array). The SoC 1200 may also include an integrated data bus or interconnect fabric (not shown) that couples the various components of the SoC for control signaling, data communication, and/or routing between the components. The integrated data bus, interconnect fabric, or other components of the SoC 1200 may be exposed or accessed through an external port, a parallel data interface, a serial data interface, a fabric-based interface, a peripheral component interface, or any other suitable data interface. For example, the components of the SoC 1200 may access or control external storage media, processing blocks, neural networks, datasets, or AI models, through an external interface or off-chip data interface.

In this example, the SoC 1200 includes various components such as input-output (I/O) control logic 1202 and a hardware-based processor 1204 (processor 1204), such as a microprocessor, a processor core, an application processor, DSP, or the like. The SoC 1200 also includes memory 1206, which may include any type and/or combination of RAM, SRAM, DRAM, non-volatile memory, ROM, one-time programmable (OTP) memory, multiple-time programmable (MTP) memory, Flash memory, and/or other suitable electronic data storage. In some aspects, the processor 1204 and code stored on the memory 1206 are implemented as a storage system controller or storage aggregator to provide various functionalities associated with RL-enabled LDPC decoding. In the context of this disclosure, the memory 1206 stores data, code, instructions, or other information via non-transitory signals, and does not include carrier waves or transitory signals. Alternately or additionally, the SoC 1200 may comprise a data interface (not shown) for accessing additional or expandable off-chip storage media, such as solid-state memory (e.g., Flash or NAND memory), magnetic-based memory media, or optical-based memory media.

The SoC 1200 may also include firmware 1208, applications, programs, software, and/or an operating system, which may be embodied as processor-executable instructions maintained on the memory 1206 for execution by the processor 1204 to implement functionalities of the SoC 1200. The SoC 1200 may also include other communication interfaces, such as a transceiver interface for controlling or communicating with components of a local on-chip (not shown) or off-chip communication transceiver. Thus, in some aspects, the SoC 1200 may be implemented or configured as a communications transceiver that is capable of implementing aspects of RL-enabled LDPC decoding to process data received through a communication channel Alternately or additionally, the transceiver interface may also include or implement a signal interface to communicate radio frequency (RF), intermediate frequency (IF), or baseband frequency signals off-chip to facilitate wired or wireless communication through transceivers, physical layer transceivers (PHYs), or media access controllers (MACs) coupled to the SoC 1200. For example, the SoC 1200 may include a transceiver interface configured to enable storage over a wired or wireless network, such as to provide a network attached storage (NAS) volume with RL-enabled LDPC decoding for communicated data and/or stored data.

The SoC 1200 also includes an RL-enabled LDPC decoder 130, processing block 132, and RL agent 134, which may be implemented separately as shown or combined with a storage component, host controller, data interface, data transceiver. The RL agent 134 may also be accessible through an off-chip interface, for example ML algorithms or neural networks stored to external memory. In accordance with various aspects of RL-enabled LDPC decoding, the RL-enabled LDPC decoder processes, as part of a first decoding iteration, data of a channel to generate LDPC state information (e.g., a syndrome weight) and provides the LDPC state information to an ML algorithm of the RL agent 134. The RL-enabled LDPC decoder 130 is then configured with LDPC decoding parameters (e.g., bit flip thresholds and/or bit types) obtained from the ML algorithm and processes, as part of a second decoding operation, the data using the decoding parameters to generate subsequent LDPC state information. The RL-enabled LDPC decoder 130 provides decoded data of the channel based on the subsequent LDPC state information. Any of these entities may be embodied as disparate or combined components, as described with reference to various aspects presented herein. For example, the RL agent 134 may be implemented as part of the RL-enabled LDPC decoder 130 or processing block 132 of a storage controller or communication transceiver. Examples of these components and/or entities, or of corresponding functionality, are described with reference to the respective components or entities of the environment 100 of FIG. 1 or the respective configurations illustrated in FIG. 2 through FIG. 7, and/or the methods 800 through 1100 of FIG. 8 through FIG. 11. The RL-enabled LDPC decoder 130 or RL agent 134, either in whole or in part, may be implemented as processor-executable instructions maintained by the memory 1206 and executed by the processor 1204 to implement various aspects and/or features of RL-enabled LDPC decoding.

The RL-enabled LDPC decoder 130 and/or processing block 132, may be implemented independently or in combination with any suitable component or circuitry to implement aspects described herein. For example, the RL-enabled LDPC decoder 130 or processing block 132 may be implemented as part of a DSP, processor/storage bridge, I/O bridge, graphics processing unit, memory controller, storage controller, arithmetic logic unit (ALU), or the like. The RL-enabled LDPC decoder 130 may also be provided integrally with other entities of the SoC 1200, such as integrated with the processor 1204, the memory 1206, a storage media interface, or the firmware 1208 of the SoC 1200. Alternately or additionally, the RL-enabled LDPC decoder 130, processing block 132, and/or other components of the SoC 1200 may be implemented as hardware, firmware, fixed logic circuitry, or any combination thereof.

Figure 13:
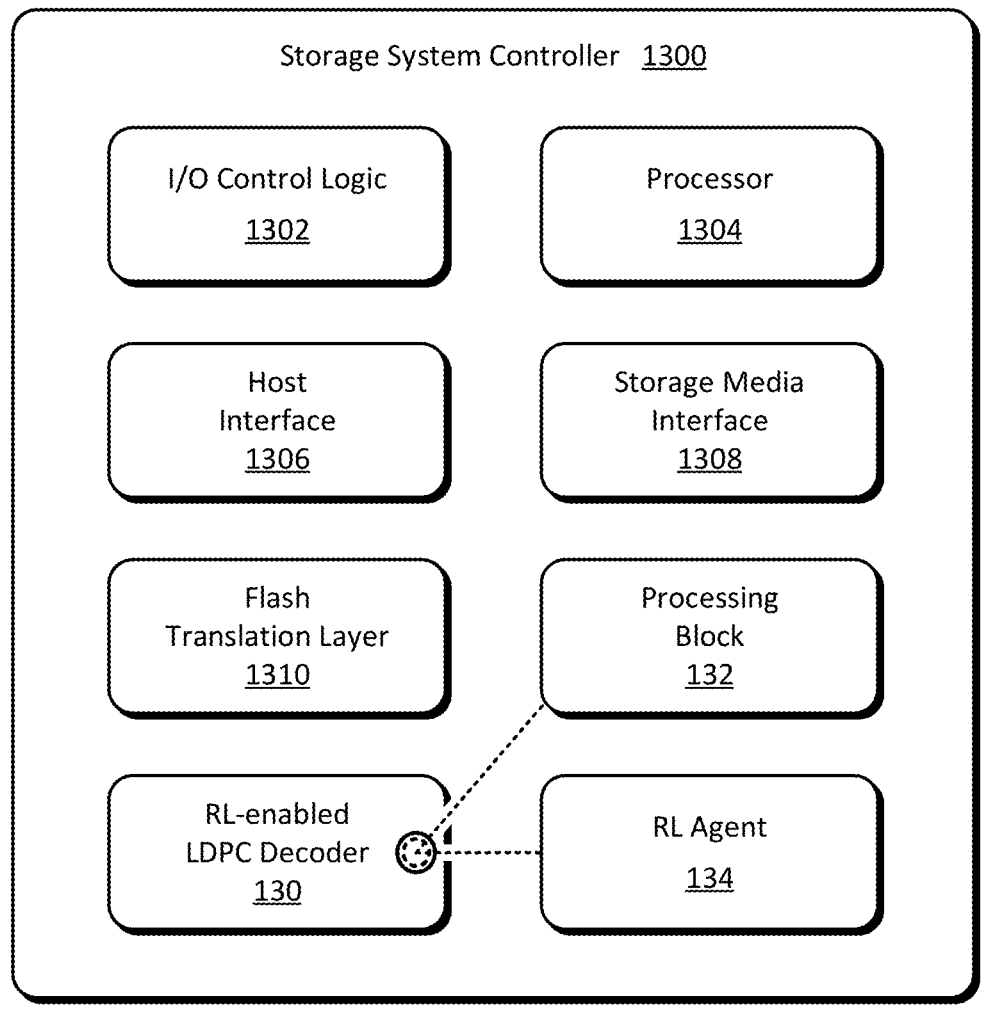
FIG. 13 illustrates an example storage system controller in which an RL-enabled LDPC decoder is implemented in accordance with one or more aspects.

As another example, consider FIG. 13 which illustrates an example storage system controller 1300 in accordance with one or more aspects of RL-enabled LDPC decoding. In various aspects, the storage system controller 1300 or any combination of components thereof may be implemented as a storage drive controller, distributed storage center controller (e.g., among a host and SSDs), storage media controller, NAS controller, Fabric interface, NVMe target, or storage aggregation controller for storage media. In some cases, the storage system controller 1300 is implemented similarly to or with components of the SoC 1200 as described with reference to FIG. 12. In other words, an instance of the SoC 1200 may be configured as a storage system controller, such as the storage system controller 1300 to manage storage media (e.g., NAND Flash-based or magnetic media) with aspects of reinforcement learning-enabled LDPC decoding.

As shown in FIG. 13, the storage system controller 1300 includes input-output (I/O) control logic 1302 and a processor 1304, such as a microprocessor, a processor core, an application processor, a DSP, or the like. In some aspects, the processor 1304 and firmware of the storage system controller 1300 may be implemented to provide various functionalities associated with RL-enabled LDPC decoding, such as those described with reference to any of the methods 800 through 1100. The storage system controller 1300 also includes a host interface 1306 (e.g., SATA, PCIe, NVMe, or Fabric interface) and a storage media interface 1308 (e.g., NAND interface, read/write channel), which enable access to a host system and storage media, respectively. The storage system controller 1300 may also include a Flash translation layer 1310 (FTL 1310), SRAM (not shown), and/or a DRAM controller (not shown). In some aspects of RL-enabled LDPC decoding, the FTL 1310 or an RL-enabled LDPC decoder (not shown) interacts with an RL-enabled LDPC decoder 130 and/or an RL agent 134 to decode data read from storage media that is operably coupled with the storage media interface 1308.

In this example, the storage system controller 1300 also includes instances of the RL-enabled LDPC decoder 130, the processing block 132, and the RL agent 134. Any or all of these components may be implemented separately as shown or combined with the processor 1304, the host interface 1306, the storage media interface 1308, the Flash translation layer 1310, and/or the RL-enabled LDPC decoder of the storage system controller 1300. Examples of these components and/or entities, or of corresponding functionality, are described with reference to the respective components or entities of the environment 100 of FIG. 1 or the respective configurations illustrated in FIG. 2 through FIG. 7. In accordance with various aspects of RL-enabled LDPC decoding, the RL-enabled LDPC decoder processes, as part of a first decoding iteration, data of a channel to generate LDPC state information (e.g., a syndrome weight) and provides the LDPC state information to an ML algorithm of the RL agent 134. The RL-enabled LDPC decoder 130 is then configured with LDPC decoding parameters (e.g., bit flip thresholds and/or bit types) obtained from the ML algorithm and processes, as part of a second decoding operation, the data using the decoding parameters to generate subsequent LDPC state information. The RL-enabled LDPC decoder 130 provides decoded data of the channel based on the subsequent LDPC state information. By using the LDPC decoding parameters provided by the ML algorithm of the RL agent 134, the RL-enabled LDPC decoder 130 may decode channel data in fewer decoding iterations or with a higher success rate, thereby improving LDPC decoding performance.

In the following, some examples of RL-enabled LDPC decoding are described in accordance with one or more aspects:

Example 1: A method for reinforcement learning-enabled low-density parity check decoding, comprising: processing, as part of a first decoding iteration, data of a channel with a low-density parity check (LDPC) decoder to generate LDPC state information; providing the LDPC state information to a machine learning (ML) algorithm of a reinforcement learning (RL) agent; obtaining LDPC decoding parameters from the ML algorithm of the RL agent; configuring the LDPC decoder with the LDPC decoding parameters obtained from the ML algorithm; processing, as part of a second decoding iteration, the data with the LDPC decoder using the decoding parameters to generate subsequent LDPC state information; and providing decoded data of the channel based on the subsequent LDPC state information that is generated with the LDPC decoding parameters obtained from the ML algorithm.

Example 2: The method of example 1 or any other example, further comprising receiving the data from the channel and providing the data of the channel to the LDPC decoder.

Example 3: The method of example 2 or any other example, wherein the receiving the data of the channel comprises: receiving the data from a storage channel via a storage media interface; or receiving the data from a communication channel via a transceiver.

Example 4: The method of example 1 or any other example, wherein: the processing of the data as part of the first decoding iteration with the LDPC decoder comprises flipping a bit value of a variable node representative of a corresponding bit in the data; or the processing of the data as part of the second decoding iteration with the LDPC decoder comprises flipping a bit value of a variable node representative of a corresponding bit in the data.

Example 5: The method of any one of examples 1 to 4 or any other example, wherein the LDPC state information provided to the ML algorithm of the RL agent comprises one of: a decoding result of the first iteration of the decoding; an LDPC vector for a bit of the data being decoded; a bit flip vector for a bit of the data being decoded; a syndrome weight for the data being decoded; or a number of unsatisfied checks for a bit of the data being decoded.

Example 6: The method of any one of examples 1 to 5 or any other example, wherein the LDPC decoding parameters obtained from the ML algorithm of the RL agent comprise one of: a value of an LDPC decision threshold; a value of a bit flip threshold; an adjustment of a bit flip threshold; a type of bit-node to flip; or a type of bit-node to process during a subsequent iteration of decoding.

Example 7: The method of example 6 or any other example, wherein: the type of bit-node corresponds to a degree of bit-node in a parity check matrix of the LDPC decoder; and the LDPC decoding parameters comprise a selection of one bit-node type from at least two types of bit-nodes defined for the LDPC decoder.

Example 8: The method of any one of examples 1 to 7 or any other example, wherein the ML algorithm of the RL agent comprises one of a neural network (NN), a deep neural network (DNN), a recursive neural network (RNN), a deep deterministic policy gradient (DDPG), a proximal policy optimization (PPO), a Q-learning network (QN), a deep Q-learning network (DQN), or a double deep Q-learning network (DDQN).

Example 9: The method of any one of examples 1 to 8 or any other example, wherein: the data comprises data read from storage media; and the storage media comprises one of optical storage media, magnetic storage media, holographic storage media, solid-state storage media, NAND Flash memory, single-level cell (SLC) Flash memory, multi-level cell (MLC) Flash memory, triple-level cell (TLC) Flash, quad-level cell Flash (QLC), or NOR cell Flash.

Example 10: The method of any one of examples 1 to 9, wherein: the LDPC decoder comprises an RL-enabled LDPC decoder operably associated with the RL agent; and the RL-enabled LDPC decoder and RL agent are embodied as part of a storage media controller.

Example 11: The method of any one of examples 1 to 9, further comprising training the ML algorithm by performing at least one episode of training that comprises providing first LDPC state information to the ML algorithm, obtaining LDPC decoding parameters from the ML algorithm based on the LDPC state information, configuring the LDPC decoder with the LDPC decoding parameters, processing data with the decoding parameters obtained from the ML algorithm to provide second LDPC state information; comparing the second LDPC state information to target LDPC state information, and applying or providing a reward to the ML algorithm based on the comparison.

Example 12: The method of example 11 or any other example, wherein the comparison indicates an increase in syndrome weight of the data being decoded and the reward comprises a negative reward applied or provided to the ML algorithm.

Example 13: The method of example 11 or any other example, wherein the comparison indicates a decrease in syndrome weight of the data being decoded and the reward comprises a positive reward applied or provided to the ML algorithm.

Example 14: The method of any one of examples 11 to 13, further comprising saving the ML parameters of the ML algorithm when training of the algorithm is complete or a number of training episodes reaches a predetermined training episode threshold.

Example 15: An apparatus comprising: a data interface configured for communication of data through a channel; a reinforcement learning (RL) agent configured to implement a machine learning (ML) algorithm for RL-enabled decoding; and an RL-enabled low-density parity check (LDPC) decoder configured to implement any one of the methods of examples 1 to 14.

Example 16: An apparatus comprising: a data interface configured for communication of data through a channel; a reinforcement learning (RL) agent configured to implement a machine learning (ML) algorithm for RL-enabled decoding; and an RL-enabled low-density parity check (LDPC) decoder configured to: process, as part of a first decoding iteration, data received from the channel to generate LDPC state information; provide the LDPC state information to the ML algorithm of the RL agent; obtain LDPC decoding parameters from the ML algorithm of the RL agent; process, as part of a second decoding iteration, the data using the decoding parameters obtained from the ML algorithm to generate subsequent LDPC state information; and provide decoded data of the channel based on the subsequent LDPC state information that is generated with the LDPC decoding parameters obtained from the ML algorithm.

Example 17: The apparatus of example 16 or any other example, wherein: the data interface comprises a storage media interface and the RL-enabled LDPC decoder is further configured to read, via the storage media interface, the data from storage media operably coupled to the apparatus; or the data interface comprises a data transceiver and the RL-enabled LDPC decoder is further configured to receive, via the data transceiver, the data through the channel from a transmitter.

Example 18: The apparatus of example 16 or example 17, wherein the LDPC state information provided to the ML algorithm of the RL agent comprises one of: a decoding result of the first iteration of the decoding; an LDPC vector for a bit of the data being decoded; a bit flip vector for a bit of the data being decoded; a syndrome weight for the data being decoded; or a number of unsatisfied checks for a bit of the data being decoded.

Example 19: The apparatus of any one of examples 16 to 18 or any other example, wherein the LDPC decoding parameters obtained from the ML algorithm of the RL agent comprise one of: a value of an LDPC decision threshold; a value of a bit flip threshold; an adjustment of a bit flip threshold; a type of bit-node to flip; or a type of bit-node to process during a subsequent iteration of decoding.

Example 20: The apparatus of any one of examples 16 to 19 or any other example, wherein the ML algorithm of the RL agent comprises one of a neural network (NN), a deep neural network (DNN), a recursive neural network (RNN), a deep deterministic policy gradient (DDPG), a proximal policy optimization (PPO), a Q-learning network (QN), a deep Q-learning network (DQN), or a double deep Q-learning network (DDQN).

Example 21: A System-on-Chip (SoC) comprising: a media interface to access storage media of a storage media system; a host interface to communicate with a host system; a reinforcement learning (RL) agent configured to implement a machine learning (ML) algorithm for RL-enabled decoding; and an RL-enabled low-density parity check (LDPC) decoder configured to: process, as part of a first decoding iteration, data read from the storage media to generate LDPC state information; provide the LDPC state information to the ML algorithm of the RL agent; obtain LDPC decoding parameters from the ML algorithm of the RL agent; process, as part of a second decoding iteration, the data with the LDPC decoder using the decoding parameters obtained from the ML algorithm to generate subsequent LDPC state information; and provide decoded data of the storage media based on the subsequent LDPC state information that is generated using the LDPC decoding parameters obtained from the ML algorithm.

Example 22: The SoC of example 21 or any other example, wherein: the RL-enabled LDPC decoder is configured as a bit-flipping decoder; and the LDPC decoding parameters from the ML algorithm comprise one of: a bit-flipping threshold for the RL-enabled LDPC decoder; or a type of bit for the RL-enabled LDPC decoder to flip during the decoding process.

Example 23: The SoC of example 21 or example 22, wherein the LDPC state information provided to the ML algorithm of the RL agent comprises one of: a decoding result of the first iteration of the decoding; an LDPC vector for a bit of the data being decoded; a bit flip vector for a bit of the data being decoded; a syndrome weight for the data being decoded; or a number of unsatisfied checks for a bit of the data being decoded.

Example 24: The SoC of any one of examples 21 to 23 or any other example, wherein the LDPC decoding parameters obtained from the ML algorithm of the RL agent comprise one of: a value of an LDPC decision threshold; a value of a bit flip threshold; an adjustment of a bit flip threshold; a type of bit-node to flip; or a type of bit-node to process during a subsequent iteration of decoding.

Example 25: The SoC of any one of examples 21 to 24 or any other example, wherein the ML algorithm of the RL agent comprises one of a neural network (NN), a deep neural network (DNN), a recursive neural network (RNN), a deep deterministic policy gradient (DDPG), a proximal policy optimization (PPO), a Q-learning network (QN), a deep Q-learning network (DQN), or a double deep Q-learning network (DDQN).

Although the subject matter of an RL-enabled LDPC decoder has been described in language specific to structural features and/or methodological operations, it is to be understood that the subject matter defined in the appended claims is not necessarily limited to the specific examples, features, or operations described herein, including orders in which they are performed.

What is claimed is:

1. A method for reinforcement learning-enabled low-density parity check decoding, comprising:
   processing, as part of a first decoding iteration, data of a channel with a low-density parity check (LDPC) decoder to generate LDPC state information;
   providing the LDPC state information to a machine learning (ML) algorithm of a reinforcement learning (RL) agent;
   obtaining LDPC decoding parameters from the ML algorithm of the RL agent;
   configuring the LDPC decoder with the LDPC decoding parameters obtained from the ML algorithm;
   processing, as part of a second decoding iteration, the data with the LDPC decoder using the decoding parameters to generate subsequent LDPC state information; and
   providing decoded data of the channel based on the subsequent LDPC state information that is generated with the LDPC decoding parameters obtained from the ML algorithm.

2. The method of claim 1, further comprising receiving the data from the channel and providing the data of the channel to the LDPC decoder.

3. The method of claim 2, wherein the receiving the data of the channel comprises:
   receiving the data from a storage channel via a storage media interface; or
   receiving the data from a communication channel via a transceiver.

4. The method of claim 1, wherein:
   the processing of the data as part of the first decoding iteration with the LDPC decoder comprises flipping a bit value of a variable node representative of a corresponding bit in the data; or
   the processing of the data as part of the second decoding iteration with the LDPC decoder comprises flipping a bit value of a variable node representative of a corresponding bit in the data.

5. The method of claim 1, wherein the LDPC state information provided to the ML algorithm of the RL agent comprises one of:
   a decoding result of the first iteration of the decoding;
   an LDPC vector for a bit of the data being decoded;
   a bit flip vector for a bit of the data being decoded;
   a syndrome weight for the data being decoded; or
   a number of unsatisfied checks for a bit of the data being decoded.

6. The method of claim 1, wherein the LDPC decoding parameters obtained from the ML algorithm of the RL agent comprise one of:
   a value of an LDPC decision threshold;
   a value of a bit flip threshold;
   an adjustment of a bit flip threshold;
   a type of bit-node to flip; or
   a type of bit-node to process during a subsequent iteration of decoding.

7. The method of claim 6, wherein:
   the type of bit-node corresponds to a degree of bit-node in a parity check matrix of the LDPC decoder; and
   the LDPC decoding parameters comprise a selection of one bit-node type from at least two types of bit-nodes defined for the LDPC decoder.

8. The method of claim 1, wherein the ML algorithm of the RL agent comprises one of a neural network (NN), a deep neural network (DNN), a recursive neural network (RNN), a deep deterministic policy gradient (DDPG), a proximal policy optimization (PPO), a Q-learning network (QN), a deep Q-learning network (DQN), or a double deep Q-learning network (DDQN).

9. The method of claim 1, wherein:
   the data comprises data read from storage media; and
   the storage media comprises one of optical storage media, magnetic storage media, holographic storage media, solid-state storage media, NAND Flash memory, single-level cell (SLC) Flash memory, multi-level cell (MLC) Flash memory, triple-level cell (TLC) Flash, quad-level cell Flash (QLC), or NOR cell Flash.

10. The method of claim 1, wherein:
    the LDPC decoder comprises an RL-enabled LDPC decoder operably associated with the RL agent; and
    the RL-enabled LDPC decoder and RL agent are embodied as part of a storage media controller.

11. An apparatus comprising:
    a data interface configured for communication of data through a channel;
    a reinforcement learning (RL) agent configured to implement a machine learning (ML) algorithm for RL-enabled decoding; and
    an RL-enabled low-density parity check (LDPC) decoder configured to:
      process, as part of a first decoding iteration, data received from the channel to generate LDPC state information;
      provide the LDPC state information to the ML algorithm of the RL agent;
      obtain LDPC decoding parameters from the ML algorithm of the RL agent;
      process, as part of a second decoding iteration, the data using the decoding parameters obtained from the ML algorithm to generate subsequent LDPC state information; and
      provide decoded data of the channel based on the subsequent LDPC state information that is generated with the LDPC decoding parameters obtained from the ML algorithm.

12. The apparatus of claim 11, wherein:
    the data interface comprises a storage media interface and the RL-enabled LDPC decoder is further configured to read, via the storage media interface, the data from storage media operably coupled to the apparatus; or the data interface comprises a data transceiver and the RL-enabled LDPC decoder is further configured to receive, via the data transceiver, the data through the channel from a transmitter.

13. The apparatus of claim 11, wherein the LDPC state information provided to the ML algorithm of the RL agent comprises one of:
   a decoding result of the first iteration of the decoding;
   an LDPC vector for a bit of the data being decoded;
   a bit flip vector for a bit of the data being decoded;
   a syndrome weight for the data being decoded; or
   a number of unsatisfied checks for a bit of the data being decoded.

14. The apparatus of claim 11, wherein the LDPC decoding parameters obtained from the ML algorithm of the RL agent comprise one of:
   a value of an LDPC decision threshold;
   a value of a bit flip threshold;
   an adjustment of a bit flip threshold;
   a type of bit-node to flip; or
   a type of bit-node to process during a subsequent iteration of decoding.

15. The apparatus of claim 14, wherein the ML algorithm of the RL agent comprises one of a neural network (NN), a deep neural network (DNN), a recursive neural network (RNN), a deep deterministic policy gradient (DDPG), a proximal policy optimization (PPO), a Q-learning network (QN), a deep Q-learning network (DQN), or a double deep Q-learning network (DDQN).

16. A System-on-Chip (SoC) comprising:
   a media interface to access storage media of a storage media system;
   a host interface to communicate with a host system;
   a reinforcement learning (RL) agent configured to implement a machine learning (ML) algorithm for RL-enabled decoding; and
   an RL-enabled low-density parity check (LDPC) decoder configured to:
      process, as part of a first decoding iteration, data read from the storage media to generate LDPC state information;
      provide the LDPC state information to the ML algorithm of the RL agent;
      obtain LDPC decoding parameters from the ML algorithm of the RL agent;
      process, as part of a second decoding iteration, the data with the LDPC decoder using the decoding parameters obtained from the ML algorithm to generate subsequent LDPC state information; and
      provide decoded data of the storage media based on the subsequent LDPC state information that is generated using the LDPC decoding parameters obtained from the ML algorithm.

17. The SoC of claim 16, wherein:
   the RL-enabled LDPC decoder is configured as a bit-flipping decoder; and
   the LDPC decoding parameters from the ML algorithm comprise one of:
      a bit-flipping threshold for the RL-enabled LDPC decoder; or
      a type of bit for the RL-enabled LDPC decoder to flip during the decoding process.

18. The SoC of claim 16, wherein the LDPC state information provided to the ML algorithm of the RL agent comprises one of:
   a decoding result of the first iteration of the decoding;
   an LDPC vector for a bit of the data being decoded;
   a bit flip vector for a bit of the data being decoded;
   a syndrome weight for the data being decoded; or
   a number of unsatisfied checks for a bit of the data being decoded.

19. The SoC of claim 16, wherein the LDPC decoding parameters obtained from the ML algorithm of the RL agent comprise one of:
   a value of an LDPC decision threshold;
   a value of a bit flip threshold;
   an adjustment of a bit flip threshold;
   a type of bit-node to flip; or
   a type of bit-node to process during a subsequent iteration of decoding.

20. The SoC of claim 16, wherein the ML algorithm of the RL agent comprises one of a neural network (NN), a deep neural network (DNN), a recursive neural network (RNN), a deep deterministic policy gradient (DDPG), a proximal policy optimization (PPO), a Q-learning network (QN), a deep Q-learning network (DQN), or a double deep Q-learning network (DDQN).

* * * * *